United States Patent
Bai et al.

(10) Patent No.: US 10,044,355 B2
(45) Date of Patent: Aug. 7, 2018

(54) RECONFIGURABLE CIRCUIT WITH CROSSBAR SWITCHES INCLUDING NON-VOLATILE RESISTIVE SWITCHES

(71) Applicant: NEC Corporation, Tokyo (JP)

(72) Inventors: Xu Bai, Tokyo (JP); Noboru Sakimura, Tokyo (JP); Yukihide Tsuji, Tokyo (JP); Ryusuke Nebashi, Tokyo (JP); Ayuka Tada, Tokyo (JP); Makoto Miyamura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/572,653

(22) PCT Filed: May 28, 2015

(86) PCT No.: PCT/JP2015/066125
§ 371 (c)(1),
(2) Date: Nov. 8, 2017

(87) PCT Pub. No.: WO2016/189751
PCT Pub. Date: Dec. 1, 2016

(65) Prior Publication Data
US 2018/0123595 A1    May 3, 2018

(51) Int. Cl.
*H03K 19/177* (2006.01)
*G11C 7/10* (2006.01)
*G11C 7/06* (2006.01)

(52) U.S. Cl.
CPC . *H03K 19/17728* (2013.01); *H03K 19/17744* (2013.01); *G11C 7/06* (2013.01); *G11C 7/1051* (2013.01); *G11C 7/1078* (2013.01)

(58) Field of Classification Search
CPC ............... H03K 19/17728; H03K 19/17744
USPC ........................................ 326/37–41, 47
See application file for complete search history.

(56) References Cited

U.S. PATENT DOCUMENTS

| | | | |
|---|---|---|---|
| 4,899,067 A | 2/1990 | So et al. | |
| 7,982,504 B1* | 7/2011 | Robinett | H01L 21/82387 326/101 |
| 8,816,312 B2 | 8/2014 | Tada et al. | |
| 8,837,242 B2 | 9/2014 | Riho et al. | |
| 8,860,460 B1 | 10/2014 | Cashman | |
| 2010/0108479 A1* | 5/2010 | Ebeling | H01H 59/0009 200/181 |

OTHER PUBLICATIONS

Munehiro Tada et al., "Polymer Solid-Electrolyte Switch Embedded on CMOS for Nonvolatile Crossbar Switch", IEEE Transactions on Electron Devices, Dec. 2011, pp. 4398-4406, vol. 58, No. 12.
(Continued)

*Primary Examiner* — Dylan White
(74) *Attorney, Agent, or Firm* — Sughrue Mion, PLLC

(57) ABSTRACT

A reconfigurable circuit comprising: a first level crossbar switch that has first non-volatile resistive switches; a second level crossbar switch that has second non-volatile resistive switches; and a first wire and third non-volatile resistive switches that are used for redundancy, wherein input wires of the second level crossbar switch are connected to output wires of the first level crossbar switch one-to-one, and input wires of the first level crossbar switch and output wires of the second level crossbar switch are connected to the first wire through the third non-volatile resistive switches.

10 Claims, 25 Drawing Sheets

(56) References Cited

OTHER PUBLICATIONS

Jing Huang et al., "On the defect tolerance of nano-scale two-dimensional crossbars", Proceedings of the 19th IEEE International Symposium on Defect and Fault Tolerance in VLSI system (DFT2004), 2004, pp. 96-104 (9 pages).
N. Banno et al., "Reliable Solid-Electrolyte Crossbar Switch for Programmable Logic Device", Symposium on VLSI Technology Digest of Technical Papers, 2010, pp. 115-116.
Written Opinion of the International Searching Authority of PCT/JP2015/066125 dated Aug. 18, 2015.
International Search Report of PCT/JP2015/066125 dated Aug. 18, 2015.

\* cited by examiner

○ :OFF
● :ON
⊗ :fixed OFF
⊗ :fixed ON

RECONFIGURABLE CIRCUIT WITH CROSSBAR SWITCHES INCLUDING NON-VOLATILE RESISTIVE SWITCHES

TECHNICAL FIELD

This invention is about a reconfigurable circuit using non-volatile resistive switches.

BACKGROUND ART

Semiconductor integrated circuit (IC) is constructed by transistors built on a semiconductor substrate and upper layer wires used to connect transistors. The patterns of the transistors and wires are determined in the IC design stage. The interconnections between the transistors cannot be changed after fabrication.

In reconfigurable circuits such as FPGAs (Field-Programmable Gate Arrays), configuration data including operation and interconnection information is stored in memories, so that different logic operations and interconnections can be realized by configuring the memories after fabrication according to requirements of end users. In most of commercial FPGAs, SRAM (Static Random Access Memory) is used to store the configuration data.

Typically, each SRAM is composed of 6 transistors and each modern FPGA chip has more than 10M SRAMs, which causes extremely large area overhead and cost. Data routing is realized by a large number of CMOS switches (each composed of one SRAM and one nMOS transistor), which causes low logic density, large power consumption and large delay.

To overcome the problems of SRAM-based FPGAs, non-volatile resistive switches (NVRSs) integrated between wires up on transistor layer have been proposed for small area overhead. Non-volatility also contributes to zero standby power consumption.

As an example, in the reconfigurable circuits shown in the non-patent document 1 and patent document 1, a non-volatile resistive atom switch (NVRAS) composed of a solid-electrolyte sandwiched between an active electrode (Cu) and an inert electrode (Ru) has high OFF/ON resistance ratio ($>10^5$), therefore the NVRAS can replace the CMOS switch for small area overhead and high logic density. Moreover, lower capacitance of the NVRAS than nMOS transistor leads to low power consumption and high speed. The ON/OFF state of the NVRAS is hold even when not powered, therefore when power is turned on configuration data can be loaded immediately.

Problem to be Solved by the Invention

Reconfigurable circuits may contain redundant circuitry that can be used to repair a reconfigurable circuit that contains defective transistors and wires in manufacturing, thereby improving production yield. For example, in patent document 2 and patent document 3, if defects are detected prior to shipment, redundant circuitry will replace the defective circuit before shipping to customers. Customers can configure the repaired device to perform desired logic functions correctly. However, the redundant circuitry is wasted if there is no defect, which causes area, delay and power consumption overhead.

Moreover, for the NVRS-based FPGA, rewrite cycle count of the NVRSs is limited (typically 1000 for the NVRAS in patent document 1). Defects of NVRSs may occur when customers configure the device after shipment, because a few of the NVRSs may have less rewrite cycle count than guaranteed rewrite cycle count. The defective NVRSs may be fixed ON or OFF when reconfiguration is performed, so that customers cannot configure the device to implement desired logic functions correctly. As a result, the broken device should be recalled and a substitute device should be delivered, which causes large cost.

It is desired to relieve defective NVRSs automatically after shipment to make sure customers can perform desired logic function correctly even if defects of NVRSs occur. One of relief methods usually used in memory chip is replacement of defective row/column NVRSs by redundant row/column NVRSs as shown in patent document 4. In NVRS-based reconfigurable circuit, crossbar switch using NVRSs realizes data routing. The relief method may be used to relieve defective NVRSs. As an example shown in FIG. 1A, one-level crossbar switch 301 is used to realize 4 inputs and 4 outputs data routing, and redundant switches 302 are used to relieve a defective NVRS $S_{22}$. The box in FIG. 1A shows symbols that indicate the ON and OFF states in which a normal NVRS is set and a defective NVRS is fixed. The data routing from IN2 to OUT2 cannot be realized because of the fixed OFF $S_{22}$. As shown in FIG. 1B, the redundant NVRSs $S_{R2}$ and $S_{2R}$ can be turned ON to relieve the data routing from IN2 to OUT2. The fixed OFF $S_{22}$ is successfully relieved by redundant switches 302. However, as shown in FIG. 2A, if a fixed ON NVRS $S_{12}$ defect occurs, both the IN1 and IN2 are shorted, even if the redundant NVRSs $S_{R2}$ and $S_{2R}$ are turned ON shown in FIG. 2B, the fixed ON defect cannot be relieved. The fixed ON $S_{12}$ is unsuccessfully relieved by redundant switches 302.

The purpose of this patent is to provide a reconfigurable circuit to relieve both fixed ON and OFF defects of NVRSs automatically to make sure customer can perform desired logic function even if defects occur.

[Non-patent document 1] N. Banno et al., "Reliable Solid-Electrolyte Crossbar Switch for Programmable Logic Device", Symposium on VLSI Technology, pp. 115-116, (2010).
[Patent document 1] U.S. Pat. No. 8,816,312
[Patent document 2] U.S. Pat. No. 4,899,067
[Patent document 3] U.S. Pat. No. 8,860,460
[Patent document 4] U.S. Pat. No. 8,837,242

SUMMARY OF THE INVENTION

The present invention provides a reconfigurable circuit comprises: a first level crossbar switch that has first non-volatile resistive switches; a second level crossbar switch that has second non-volatile resistive switches; and a first wire and third non-volatile resistive switches that are used for redundancy, wherein input wires of the second level crossbar switch are connected to output wires of the first level crossbar switch one-to-one, and input wires of the first level crossbar switch and output wires of the second level crossbar switch are connected to the first wire through the plurality of third non-volatile resistive switches.

According to the reconfigurable circuit by the present invention, both fixed ON and OFF defects of NVRSs can be automatically relieved to make sure customer can perform desired logic function even if defects occur.

DETAILED DESCRIPTION OF EMBODIMENTS

Embodiment 1

Figure 1A:
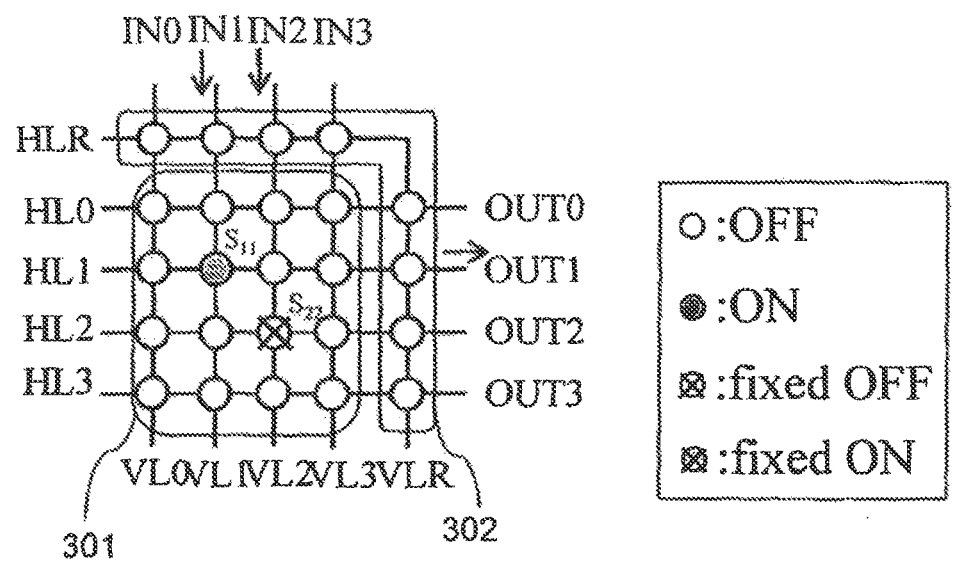
FIG. 1A illustrates that a fixed OFF NVRS defect occurs in a conventional one-level crossbar switch with redundant switches.
Figure 1B:
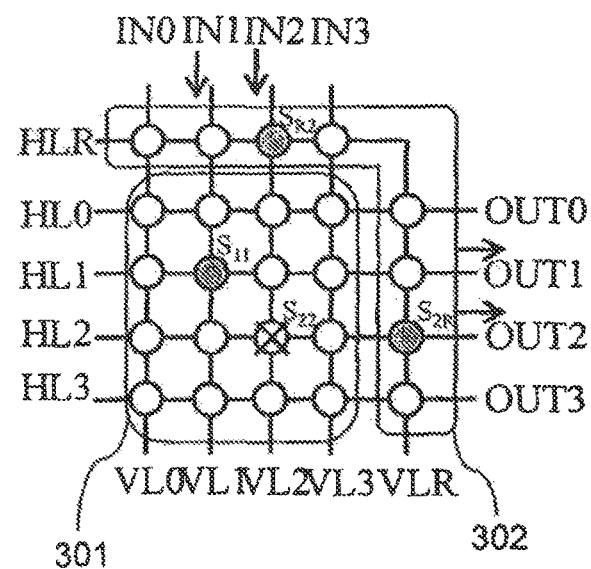
FIG. 1B illustrates that the fixed OFF NVRS defect can be relieved by the redundant switches.
Figure 2A:
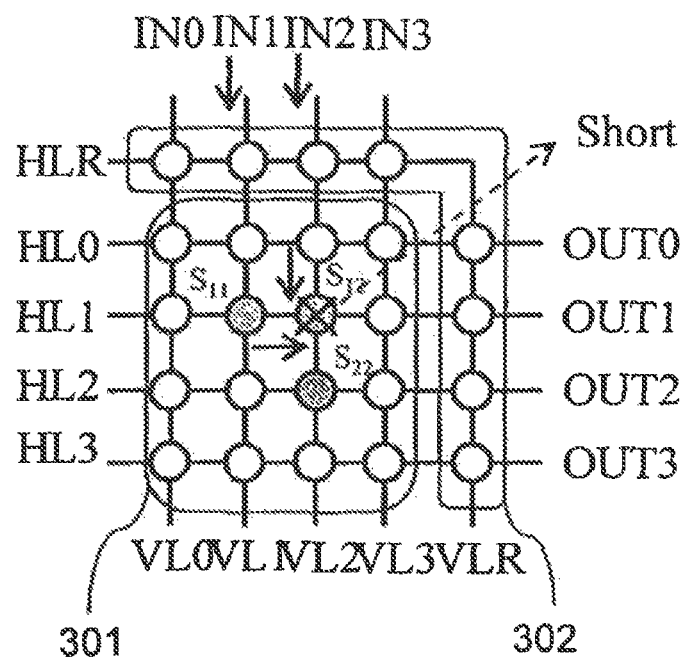
FIG. 2A illustrates that a fixed ON NVRS defect occurs in a conventional one-level crossbar switch with redundant switches.
Figure 2B:
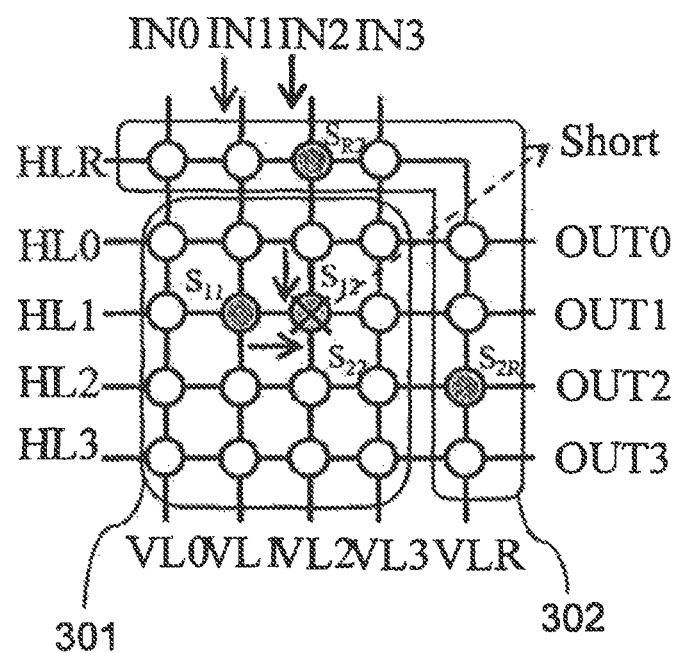
FIG. 2B illustrates that the fixed OFF NVRS defect cannot be relieved by the redundant switches.
Figure 3:
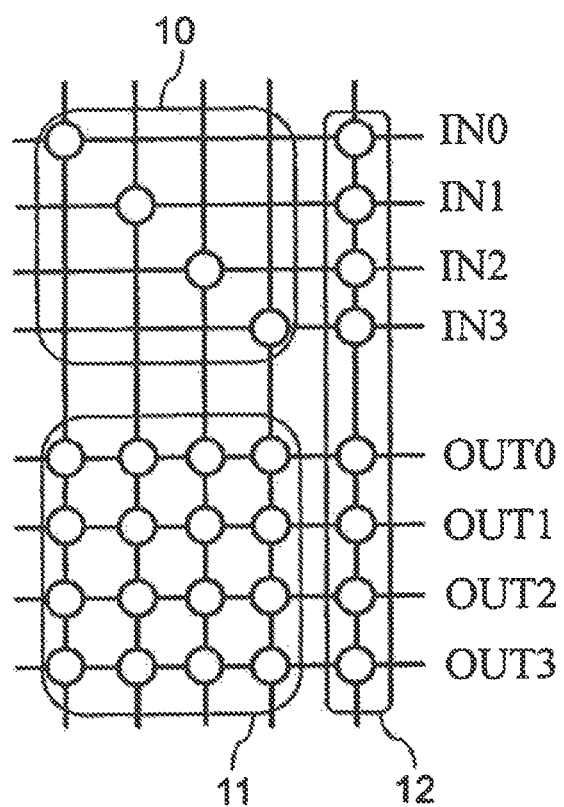
FIG. 3 illustrates a two-level crossbar switch with a redundant column in a NVRS-based reconfigurable circuit according to embodiment 1.

A first exemplary embodiment of the present invention will be described. FIG. 3 illustrates a two-level crossbar switch with a redundant column in a NVRS-based reconfigurable circuit. A 4×4 crossbar switch is used as an example. First and second wires are disposed in a first direction, while third wires and a fourth wire are disposed in a second direction intersecting the first direction. Inputs IN0, IN1, IN2 and IN3 are coupled to the first wires one-to-one, and outputs OUT0, OUT1, OUT2 and OUT3 are coupled to the second wires one-to-one. The NVRS-based reconfigurable circuit comprises first level crossbar switch 10, second level crossbar switch 11 and redundant column 12. In first level crossbar switch 10, first NVRSs through which the first wires are connected to the third wires. In second level crossbar switch 11, second NVRSs through which the second wires are connected to the third wires. In redundant column 12, third NVRSs through which the fourth wire are connected to the first and second wires. The third NVRSs in the redundant column should be kept OFF, if there is no defective NVRS in the two-level crossbar switch. FIG. 3 only shows one kind of two-level crossbar switches. The present invention is available for the other kinds of two-level crossbar switches. For example, both the first NVRSs and second NVRSs may be sparsely arranged.

Figure 4A:
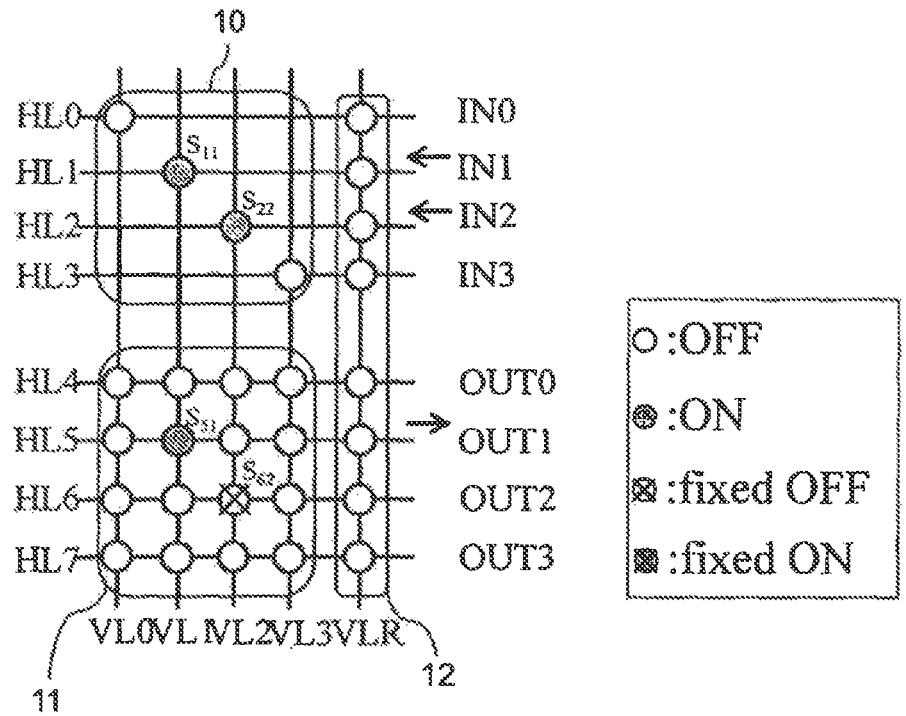
FIG. 4A illustrates that a fixed OFF NVRS defect occurs in a two-level crossbar switch with a redundant column according to embodiment 1.
Figure 4B:
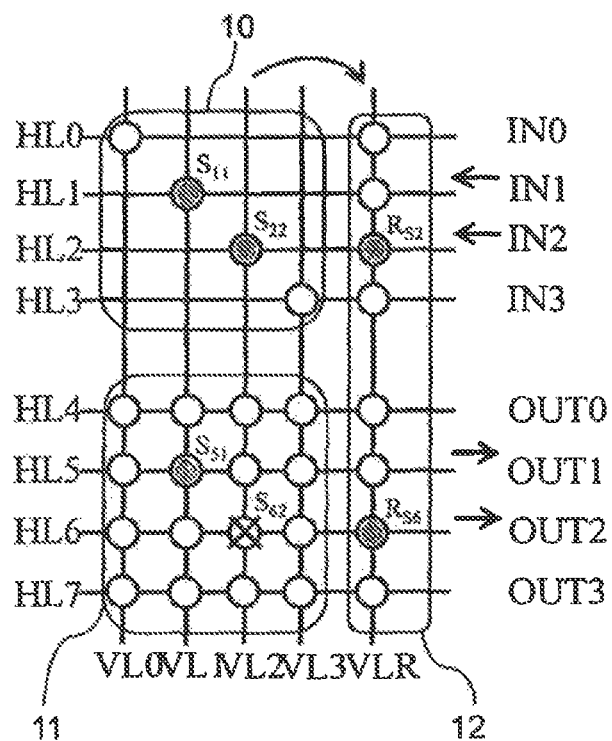
FIG. 4B illustrates that the fixed OFF NVRS defect can be relieved by the redundant column according to embodiment 1.

FIGS. 4A and 4B illustrate relief of a fixed OFF NVRS defect in the reconfigurable circuit according to embodiment 1. The box in FIG. 4A shows symbols that indicate the ON and OFF states in which a normal NVRS is set and a defective NVRS is fixed. As shown in FIG. 4A, to perform routing paths IN1-to-OUT1 and IN2-to-OUT2, NVRSs $S_{11}$, $S_{22}$, $S_{51}$ and $S_{62}$ should be turned on. However, the routing path IN2-to-OUT2 cannot be successfully performed, because the NVRS $S_{62}$ fails to be turned ON (fixed OFF defect). To relieve the fixed OFF $S_{62}$, redundant column 12 replaces the defective column VL2. The NVRSs $R_{s2}$ and $R_{s6}$ in redundant column 12 are turned ON as shown in FIG. 4B. As a result, the routing path IN2-to-OUT2 is relieved.

Figure 5A:
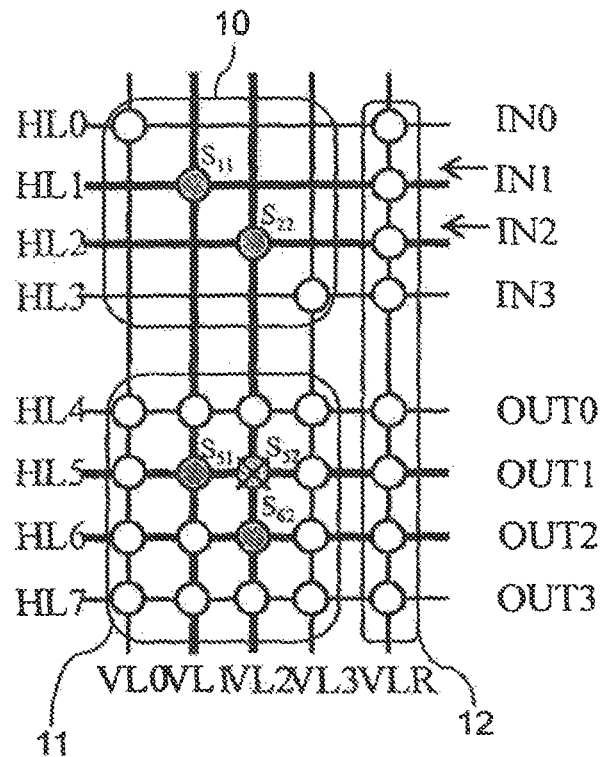
FIG. 5A illustrates that a fixed ON NVRS defect occurs in a two-level crossbar switch with a redundant column according to embodiment 1.
Figure 5B:
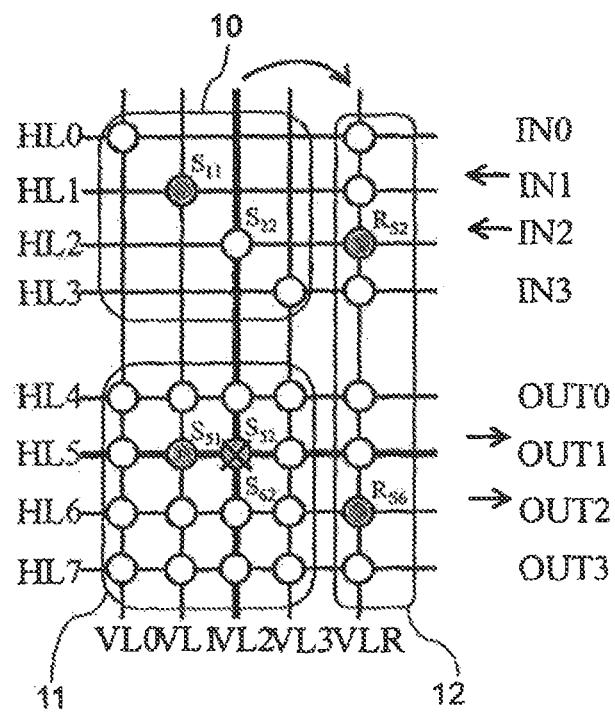
FIG. 5B illustrates that the fixed ON NVRS defect can be relieved by the redundant column according to embodiment 1.

FIGS. 5A and 5B illustrate relief of a fixed ON NVRS defect in the reconfigurable circuit according to embodiment 1. As shown in FIG. 5A, to perform routing paths IN1-to- OUT1 and IN2-to-OUT2, NVRSs $S_{11}$, $S_{22}$, $S_{51}$ and $S_{62}$ should be turned on. However, the NVRS $S_{52}$ fails to be turned OFF (fixed ON defect), which results in collision of IN1 and IN2. As a result, both the routing paths IN1-to-OUT1 and IN2-to-OUT2 cannot be successfully performed. To relieve the fixed ON $S_{52}$, redundant column 12 replaces the defective column VL2. The NVRSs $R_{s2}$ and $R_{s6}$ in redundant column 12 are turned ON, and $S_{22}$ and $S_{62}$ in defective column VL2 are turned OFF shown in FIG. 5B. As a result, both the routing paths IN1-to-OUT1 and IN2-to-OUT2 are relieved.

Figure 6:
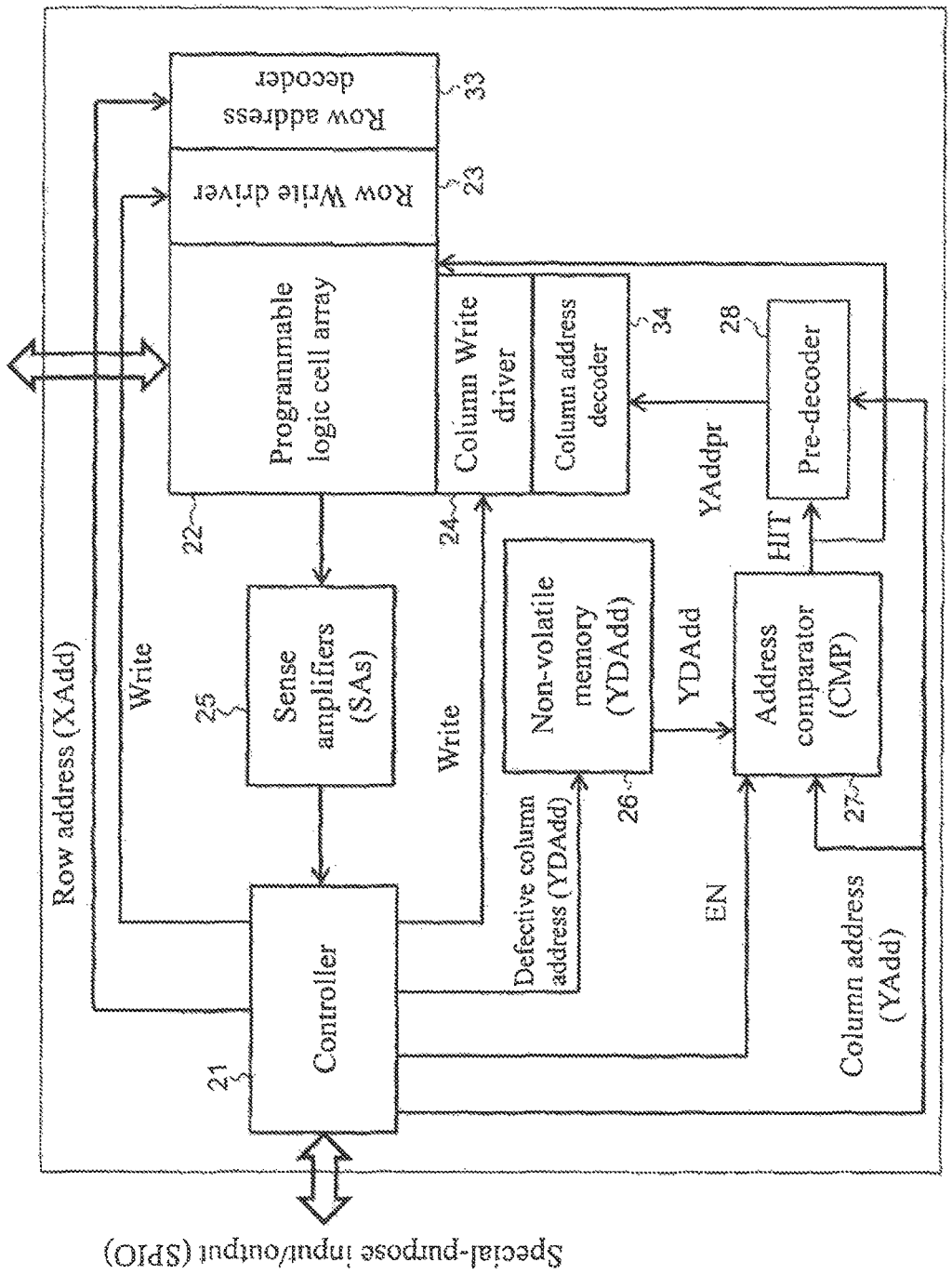
FIG. 6 illustrates structure of the NVRS-based reconfigurable circuit according to embodiment 1.

FIG. 6 illustrates structure of the reconfigurable circuit according to embodiment 1. The reconfigurable circuit comprises controller 21, programmable logic cell array (PLCA) 22, row and column write drivers 23, 24, row and column address decoders 33, 34, sense amplifier (SA) 25, non-volatile memory 26, address comparator (CMP) 27, pre-decoder 28, a special-purpose input/output (SPIO) and a general-purpose input/output (GPIO). In PLCA 22, many logic blocks are connected with each other using the two-level crossbar switches shown in FIG. 3. Any logic function can be performed according to configuration data from outside through the SPIO. Controller 21 receives configuration data and row/column addresses from outside, controls write and read operation of NVRSs, detect the defective column address by comparing actual configuration result of NVRSs with the configuration data. Row and column address decoders 33, 34 receiving addresses from controller 21 select a NVRS to be written or read. Row and column write drivers 23, 24 generate set/reset voltage to turn ON/OFF the selected NVRS. SA 25 reads the state of the selected NVRS. Non-volatile memory 26 stores defective column address detected by controller 21. If a defect of a NVRS occurs, controller 21 will enable CMP 27 to compare a column address with the defective column address stored in non-volatile memory 26. If same, a redundant column enable signal HIT will be activated to "HIGH". Pre-decoder 28 will prevent the column address from entering column address decoder 34, and enable redundant column 12. As a result, the NVRSs in redundant column 12 will be configured instead of the NVRSs in the defective column. The redundant column enable signal HIT corresponds to a redundancy enable signal. A line, through which the HIT is transmitted, is referred to as a redundancy enable signal line.

Figure 7:
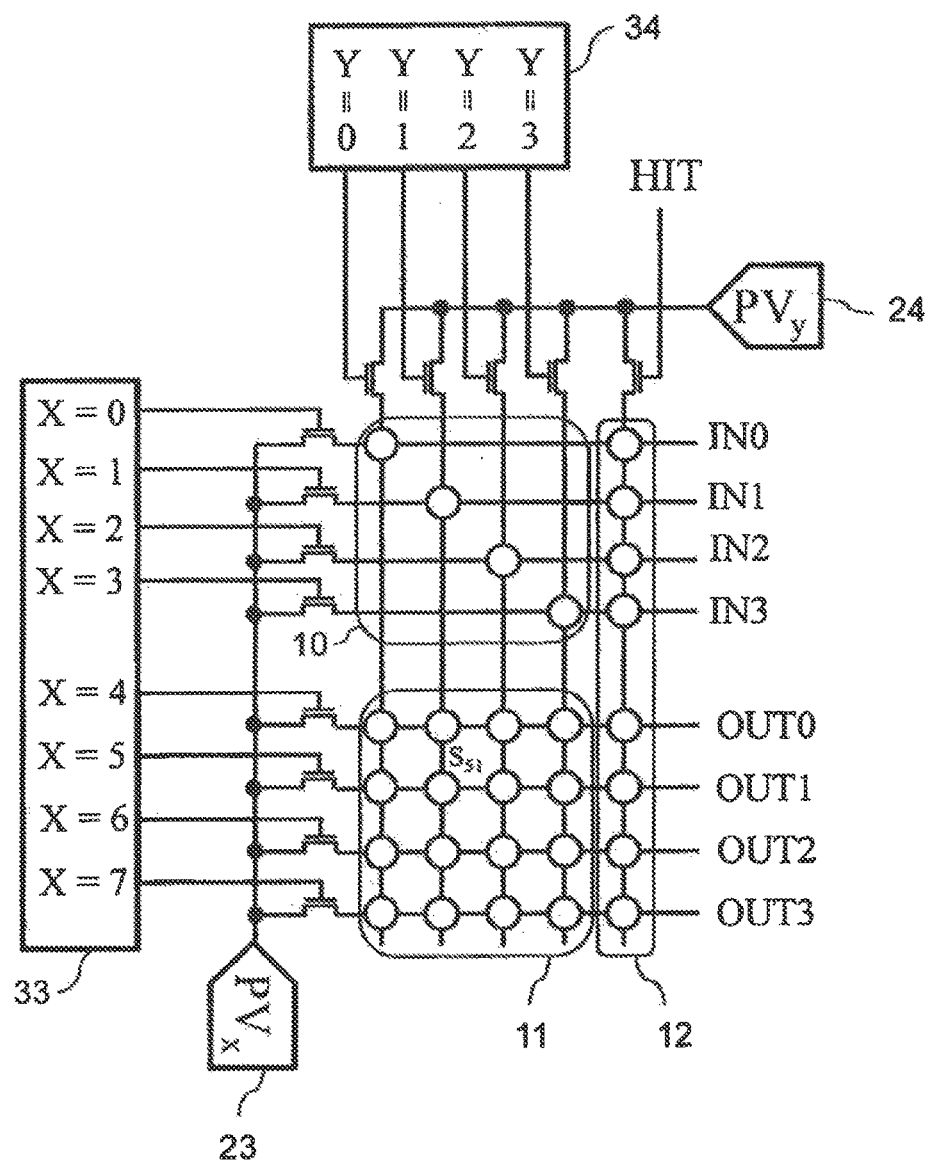
FIG. 7 illustrates a write circuit of the NVRS in a two-level crossbar switch with a redundant column according to embodiment 1.

FIG. 7 illustrates a write circuit for the NVRSs in NVRS-based reconfigurable circuit according to embodiment 1. The first and second wires are connected to first transistors one-to-one. Row address decoder 33 controls the first transistors to select one of the first and second wires to be connected to a row write driver $PV_X$. The third wires are connected to second transistors one-to-one. Column address decoder 34 controls the second transistors to select one of the third wires to be connected to a column write driver $PV_Y$. The fourth wire is connected to the column write driver $PV_Y$ through a third transistor controlled by redundant column 12 enable signal HIT. Let me explain how to write $S_{51}$ as an example. We set row address X=5 and column address Y=1, $PV_X$ and $PV_Y$ are connected to a NVRS $S_{51}$. In case $S_{51}$ is a NVRAS, $PV_X$ is connected to an active electrode (Cu) and $PV_Y$ is connected to an inert electrode (Ru). If we want to configure $S_{51}$ as "ON" state, $PV_X$ should supply a high voltage and $PV_Y$ should supply a low voltage. In another word, a positive voltage is applied to $S_{51}$. On the other hand, if we want to configure $S_{51}$ as "OFF" state, $PV_X$ should supply a low voltage and $PV_Y$ should supply a high voltage. In another word, a negative voltage is applied to $S_{51}$.

Figure 8:
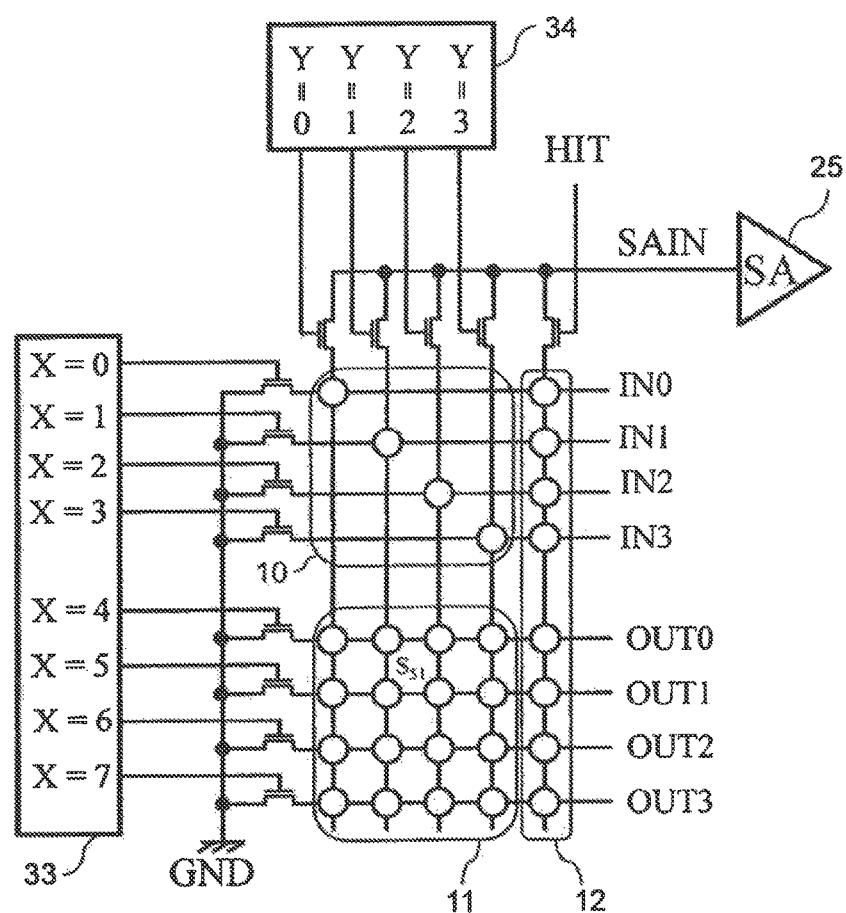
FIG. 8 illustrates a read circuit of the NVRS in a two-level crossbar switch with a redundant column according to embodiment 1.

FIG. 8 illustrates a read circuit for the NVRSs in NVRS-based reconfigurable circuit according to embodiment 1. The principle is to apply a relative small positive voltage to a target NVRS, and use SA 25 to detect the current flows through the target NVRS to read its state. It is different from FIG. 7 that the first and second wires are connected to ground line GND through the first transistors, and the third wires and the fourth wire are connected to SA 25 through the second transistors and the third transistor, respectively. Let me explain how to read state of $S_{51}$ as an example. We set row address X=5 and column address Y=1, $S_{51}$ is connected to SA 25 and GND. SA 25 clamps a fixed voltage (typically lower than 1V) applied to $S_{51}$, and detects current flow through $S_{51}$. If large current flows, the state of $S_{51}$ is ON, otherwise, if there is almost no current flow, the state is OFF.

Figure 9:
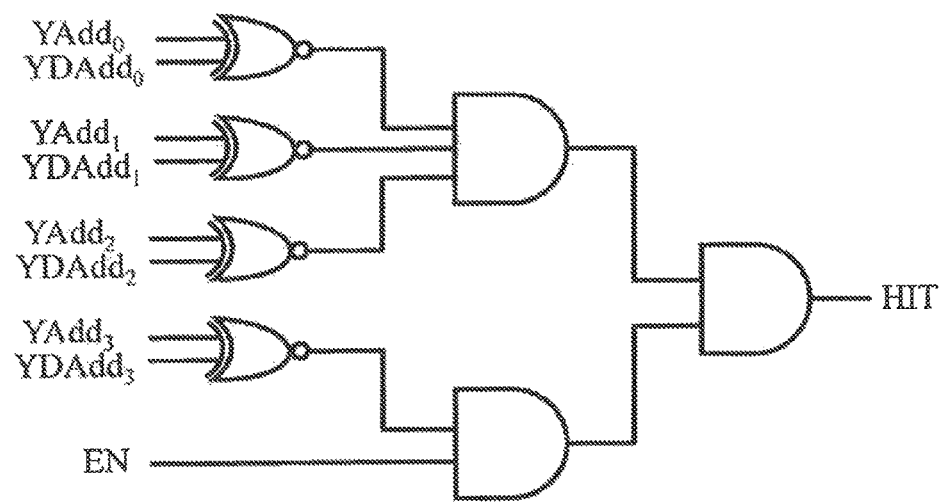
FIG. 9 illustrates an address comparator in the NVRS-based reconfigurable circuit according to embodiment 1.

FIG. 9 illustrates the CMP in NVRS-based reconfigurable circuit according to embodiment 1. CMP 27 includes 4 XNOR gates that compare respective bits of a defective column address YDAdd with respective bits of the column address YAdd, and a 5-input AND gate that receives the enable bit EN and 4 output signals from these 4 XNOR gates. HIT is activated to "HIGH" on condition that all the bits of the defective column address YDAdd match the bits of the column address YAdd and that the enable bit EN is "HIGH".

Figure 10:
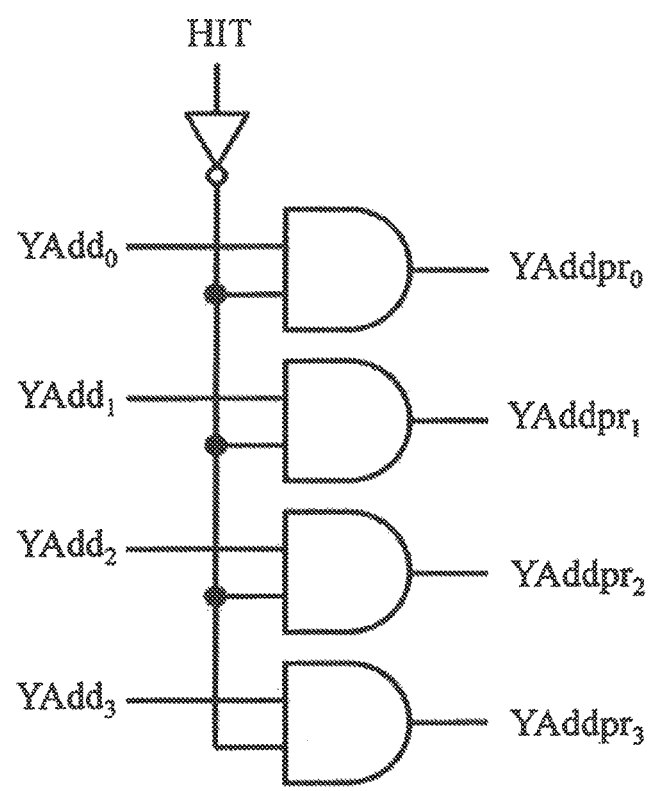
FIG. 10 illustrates a pre-decoder in the NVRS-based reconfigurable circuit according to embodiment 1.

FIG. 10 illustrates the pre-decoder in NVRS-based reconfigurable circuit according to embodiment 1. Pre-decoder 28 consists of 4 AND gates and a NOT gate. When HIT is activated to "HIGH", the output pre-decoded column address bits $YAddpr_0 \sim YAddpr_3$ become "LOW". Otherwise, when HIT is "LOW", the output pre-decoded column address bits $YAddpr_0 \sim YAddpr_3$ are equal to the column address bits $YAdd_0 \sim YAdd_3$.

Figure 11:
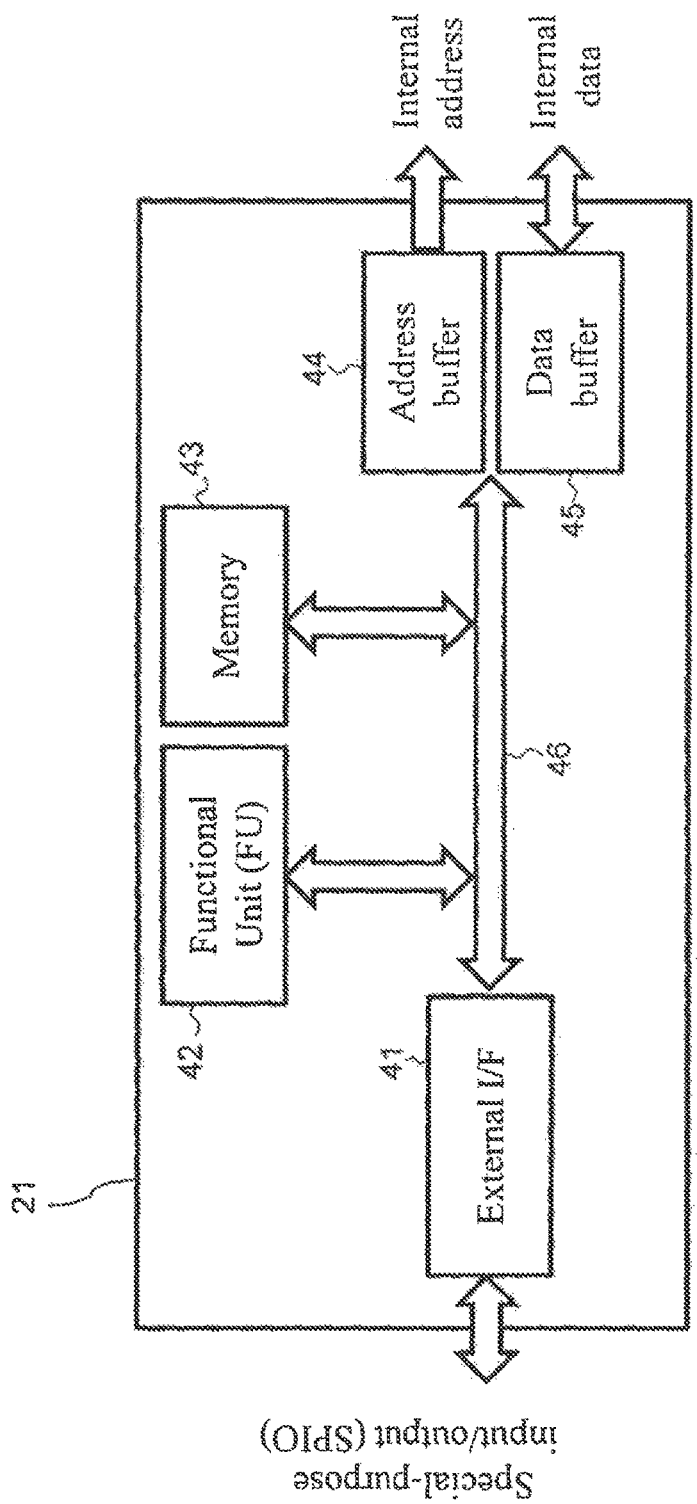
FIG. 11 illustrates a controller in the NVRS-based reconfigurable circuit according to embodiment 1.

FIG. 11 illustrates the controller in NVRS-based reconfigurable circuit according to embodiment 1. Controller 21 comprises external I/F circuit 41, functional unit (FU) 42, memory 43, address buffer 44, data buffer 45 and internal bus 46. External I/F circuit 41 controls input/output data transfer of the SPIO. FU 42 is used to control write/read operation of NVRSs, and detect defective NVRSs according to the program stored in memory 43. Address buffer 44 stores addresses from outside. Data buffer 45 stores configuration data from outside and configuration result read from PLCA 22.

Figure 12:
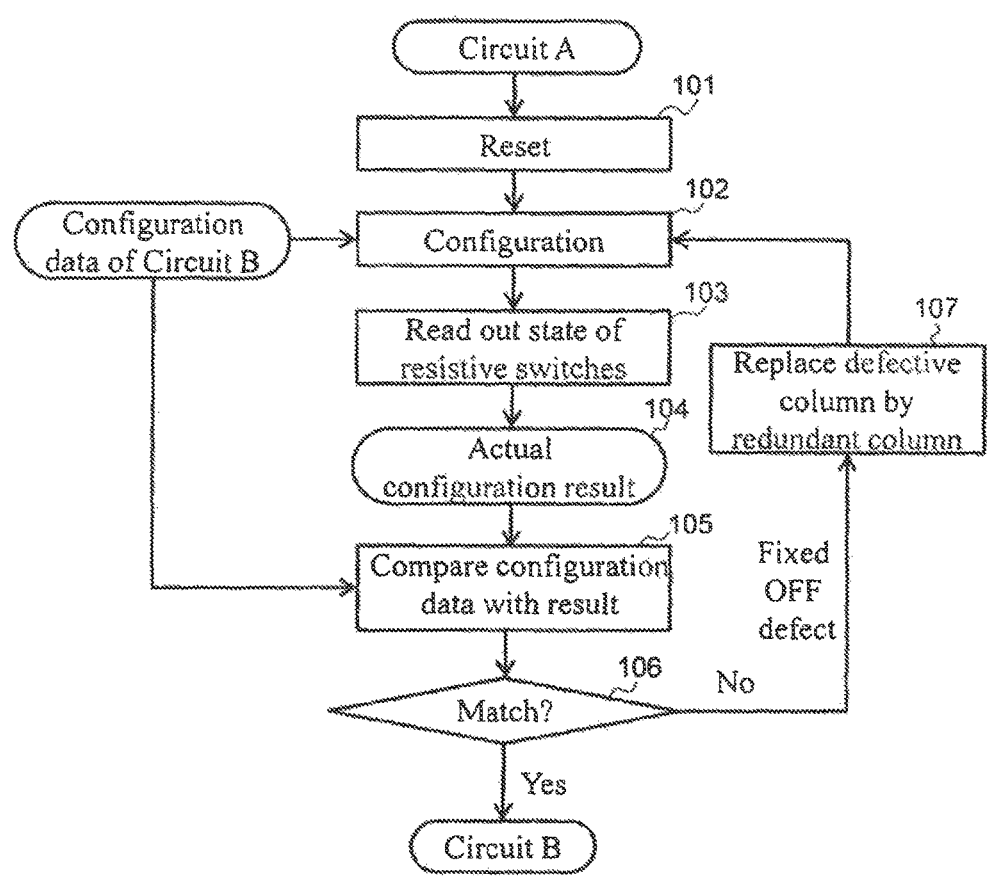
FIG. 12 illustrates configuration flow chart of the NVRS-based reconfigurable circuit when a fixed OFF NVRS defect occurs according to embodiment 1.

FIG. 12 illustrates configuration flow chart of the NVRS-based reconfigurable circuit when a fixed OFF NVRS defect occurs according to embodiment 1. We assume initial status is that a NVRS-based reconfigurable circuit has been programmed to perform a logic circuit A, and no NVRS defect has occurred. Purpose is to reprogram the NVRS-based reconfigurable circuit to perform another logic circuit B. First step 101 is to reset (turn OFF) all the NVRSs except the NVRSs in a redundant column which are initially set to be "OFF" state prior to shipment. Second step 102 is to configure the NVRS-based reconfigurable circuit according to the configuration data of the circuit B. Third step is get actual configuration result by reading out state of NVRSs using the read circuit shown in FIG. 7 (steps 103 and 104). Fourth step 105 is to compare the actual configuration result with the configuration data. If they are matched at step 106, the circuit B is successfully performed in the NVRS-based reconfigurable circuit. Otherwise, if a fixed OFF NVRS defect occurs, the corresponding defective column is replaced by the redundant column (step 107). As shown in FIG. 4, the NVRS $S_{22}$ is not necessary to be turned OFF for the replacement. Therefore the process directly loops back to second step 102 to configure the redundant column. As a result, the defective column is automatically replaced by the redundant column.

Figure 13:
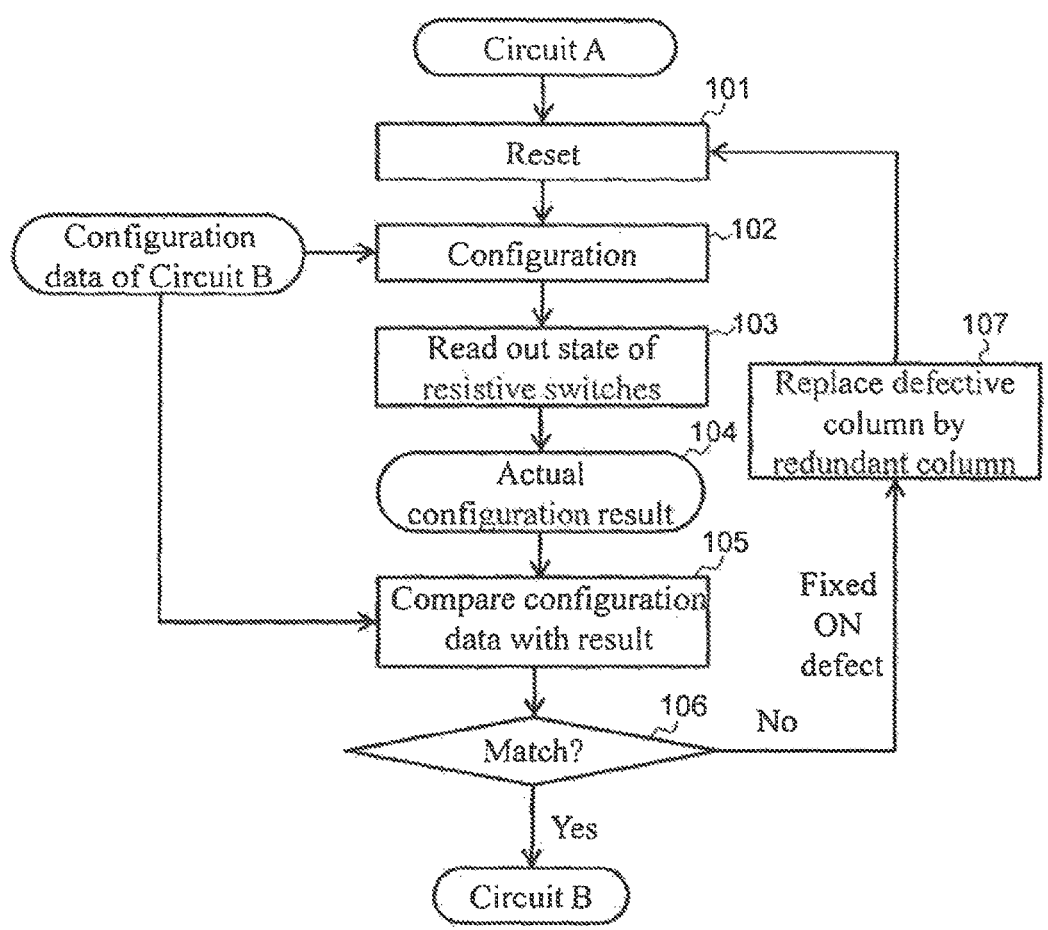
FIG. 13 illustrates configuration flow chart of the NVRS-based reconfigurable circuit when a fixed ON NVRS defect occurs according to embodiment 1.

FIG. 13 illustrates configuration flow chart of the NVRS-based reconfigurable circuit when a fixed ON NVRS defect occurs according to embodiment 1. It is different from the FIG. 12 that if a fixed ON NVRS defect occurs, the process loops back to first step 101 (reset all the NVRSs). As shown in FIG. 5, to replace of the defective column VL2 by the redundant column VLR, it is necessary to turn OFF the $S_{22}$ and $S_{62}$. If not, collision of the IN1 and IN2 still occurs even if replacement is done.

Embodiment 2

Next, a second embodiment according to the present invention will be presented. The present embodiment discloses a two-level crossbar switch with multiple redundant columns in a NVRS-based reconfigurable circuit according to embodiment 2. More than one defect column can be relieved.

Figure 14:
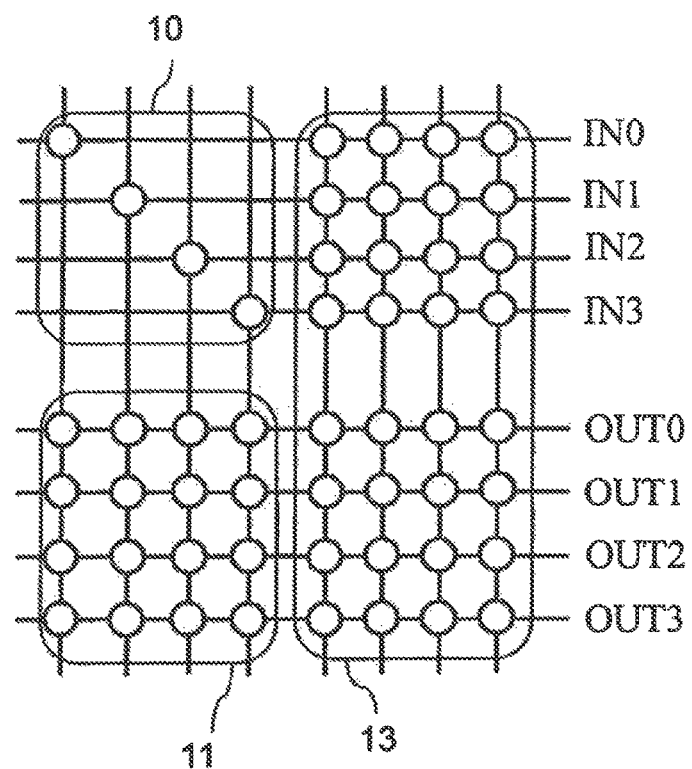
FIG. 14 illustrates a two-level crossbar switch with multiple redundant columns in a NVRS-based reconfigurable circuit according to embodiment 2.

FIG. 14 illustrates a two-level crossbar switch with multiple redundant columns in a NVRS-based reconfigurable circuit. A 4×4 crossbar switch is used as an example. First and second wires are disposed in a first direction, while third and fourth wires are disposed in a second direction intersecting the first direction. Inputs IN0, IN1, IN2 and IN3 are coupled to the first wires one-to-one, and outputs OUT0, OUT1, OUT2 and OUT3 are coupled to the second wires one-to-one. The NVRS-based reconfigurable circuit comprises first level crossbar switch 10, second level crossbar switch 11 and redundant columns 13. In first level crossbar switch 10, first NVRSs through which the first wires are connected to the third wires. In second level crossbar switch 11, second NVRSs through which the second wires are connected to the third wires. In redundant columns 13, third NVRSs through which the fourth wires are connected to the first and second wires. The third NVRSs in redundant columns 13 should be kept OFF, if there is no defective NVRS in the two-level crossbar switch. FIG. 14 only shows one kind of two-level crossbar switches. The present invention is available for the other kinds of two-level crossbar switches. For example, both the first NVRSs and second NVRSs may be sparsely arranged.

Figure 15:
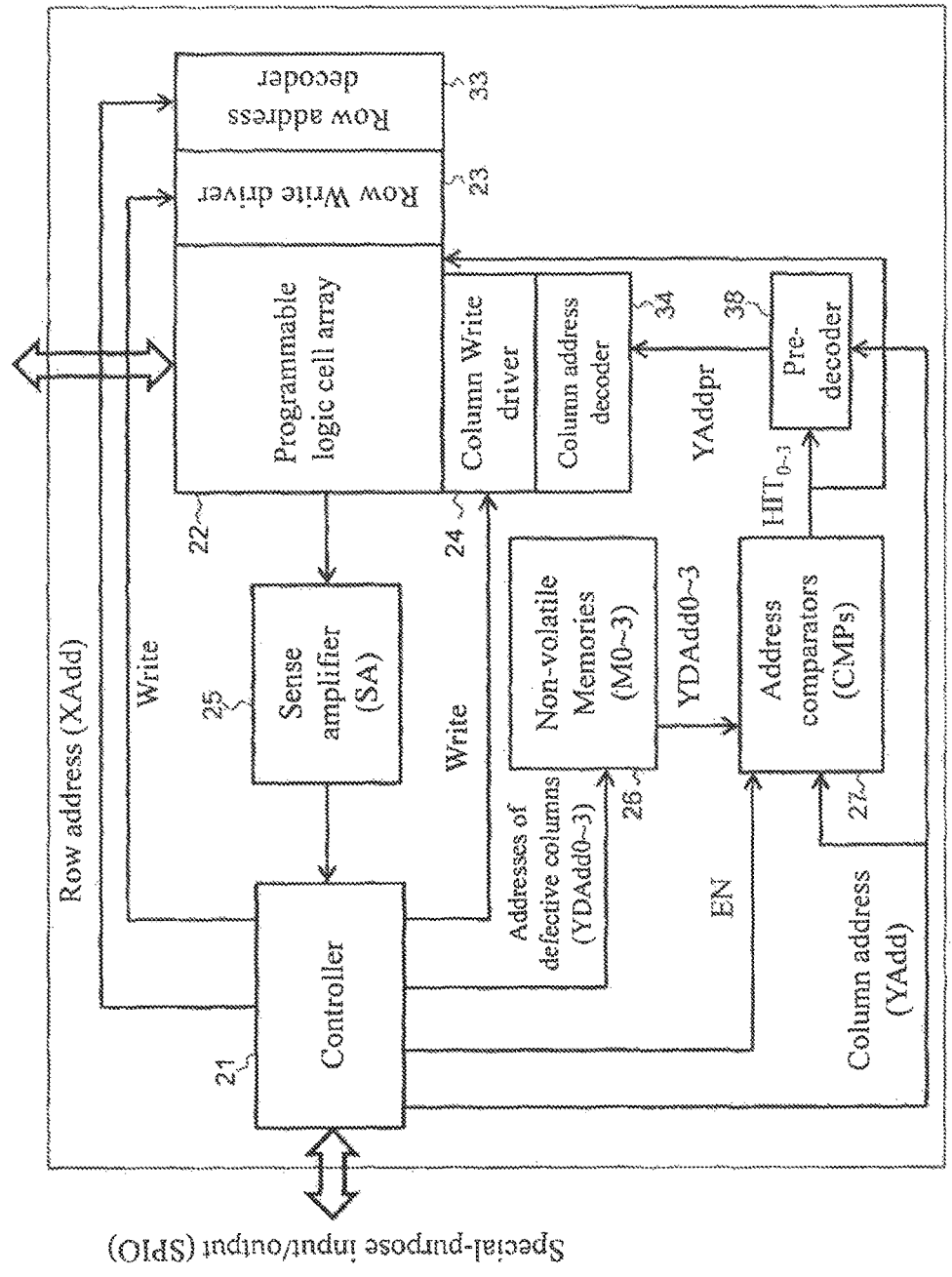
FIG. 15 illustrates structure of the NVRS-based reconfigurable circuit according to embodiment 2.

FIG. 15 illustrates structure of the reconfigurable circuit according to embodiment 2. Different parts of the reconfigurable circuit according to embodiment 2 from the reconfigurable circuit according to embodiment 1 are shown as follows. We use 4 redundant columns 13 as an example to explain the differences. 4 non-volatile memories 26 are used to store addresses of maximum 4 defective columns. 4 CMPs 27 are used to match the maximum 4 defective columns' addresses and a column address from controller 21, and generate $HIT_0 \sim HIT_3$ to control corresponding to 4 redundant columns 13 in PLCA 22.

Figure 16:
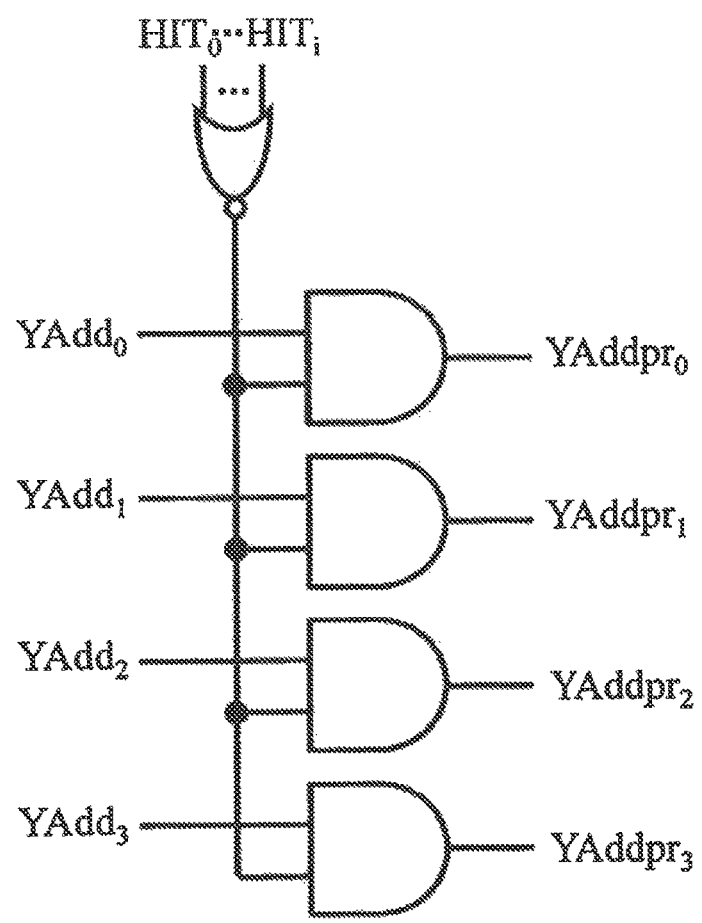
FIG. 16 illustrates a pre-decoder in the NVRS-based reconfigurable circuit according to embodiment 2.

The pre-decoder shown in FIG. 16 is different from that shown in FIG. 10 of the reconfigurable circuit according to embodiment 1. Pre-decoder 38 according to embodiment 2 consists of 4 AND gates and a NOR gate. When at least one of the $HIT_0 \sim HIT_3$ is activated to "HIGH", the output pre-decoded column address bits $YAddpr_0 \sim YAddpr_3$ become "LOW". Otherwise, when all of $HIT_0 \sim HIT_3$ are "LOW", the output pre-decoded column address bits $YAddpr_0 \sim YAddpr_3$ are equal to input column address bits $YAdd_0 \sim YAdd_3$.

Figure 17:
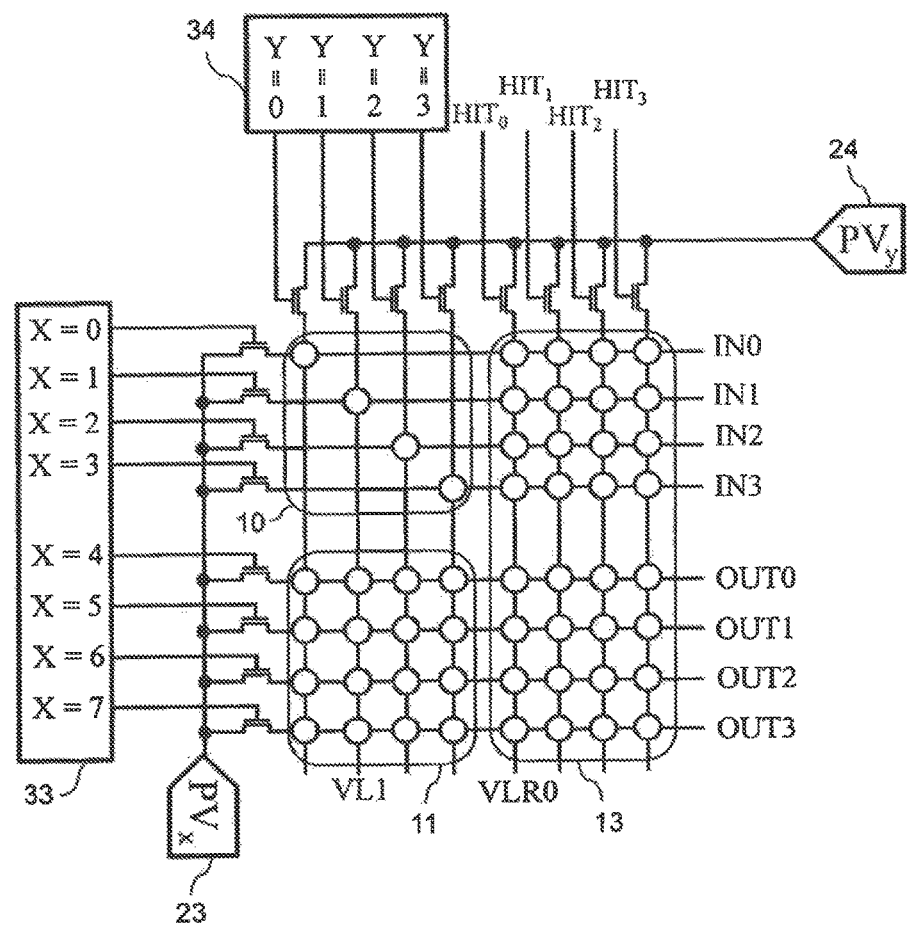
FIG. 17 illustrates a write circuit of the NVRS in a two-level crossbar switch with multiple redundant columns according to embodiment 2.
Figure 18:
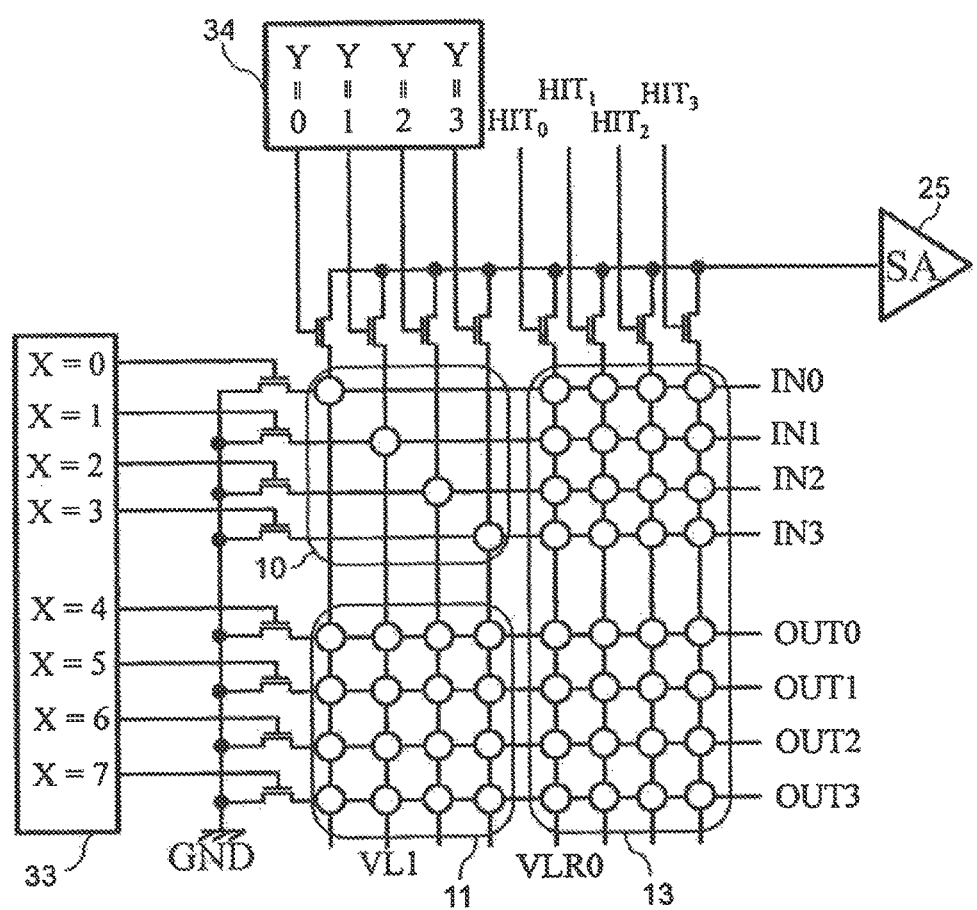
FIG. 18 illustrates a read circuit of the NVRS in a two-level crossbar switch with multiple redundant columns according to embodiment 2.

FIG. 17 and FIG. 18 illustrate write and read circuits for the NVRSs in NVRS-based reconfigurable circuit according to embodiment 2, respectively. It is different from the write and read circuits according to embodiment 1 that $HIT_0 \sim HIT_4$ are used to control third transistors of redundant columns 13. For example, if the column VL1 is defective and its address Y=1 is stored in a non-volatile memory M0 shown in FIG. 15, when controller 21 sends an column address Y=1, $HIT_0$ is active to "HIGH", and the redundant column VLR0 is written or read instead of the defective column VL1.

Figure 19A:
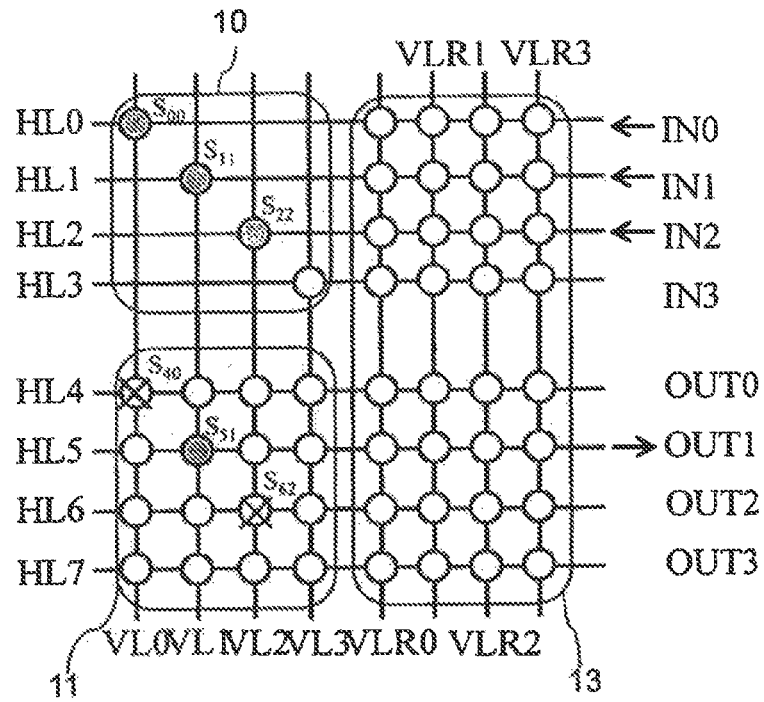
FIG. 19A illustrates that multiple fixed OFF NVRS defects occur in a two-level crossbar switch with multiple redundant columns according to embodiment 2.
Figure 19B:
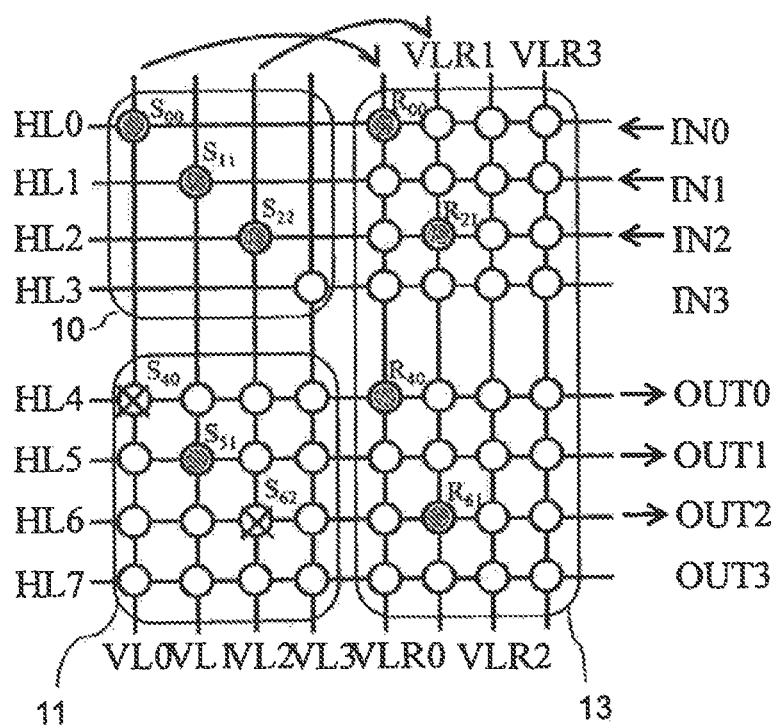
FIG. 19B illustrates that the fixed OFF NVRS defects can be relieved by the redundant columns according to embodiment 2.

FIGS. 19A and 19B illustrate relief of multiple fixed OFF NVRS defects in the reconfigurable circuit according to embodiment 2. As shown in FIG. 19A, to perform routing paths IN0-to-OUT0, IN1-to-OUT1 and IN2-to-OUT2, NVRSs $S_{00}$, $S_{11}$, $S_{22}$, $S_{40}$, $S_{51}$ and $S_{62}$ should be turned on. However, the routing paths IN0-to-OUT0 and IN2-to-OUT2 cannot be successfully performed, because the NVRSs $S_{40}$ and $S_{62}$ fail to be turned ON (fixed OFF defect). To relieve the fixed OFF $S_{40}$ and $S_{62}$, the redundant columns VLR0 and VLR1 replace the defective columns VL0 and VL2, respectively. The NVRSs $R_{00}$, $R_{40}$, $R_{21}$ and $R_{61}$ in the redundant columns VLR0 and VLR1 are turned ON as shown in FIG. 19B. As a result, the routing paths IN0-to-OUT0 and IN2-to-OUT2 are relieved.

Figure 20A:
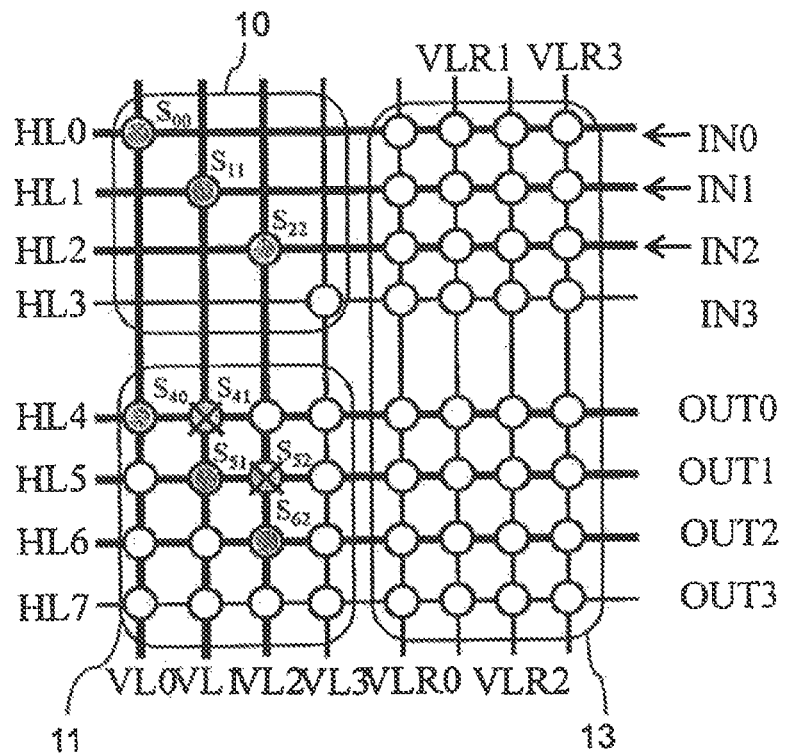
FIG. 20A illustrates that fixed ON NVRS defects occur in a two-level crossbar switch with multiple redundant columns according to embodiment 2.
Figure 20B:
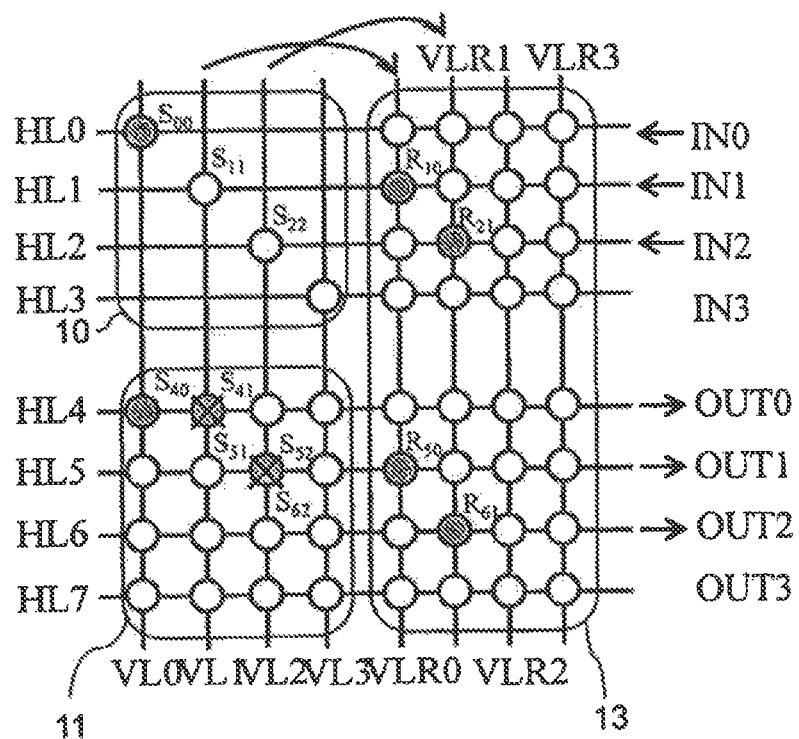
FIG. 20B illustrates that the fixed ON NVRS defects can be relieved by the redundant column according to embodiment 2.

FIGS. 20A and 20B illustrate relief of multiple fixed ON NVRS defects in the reconfigurable circuit according to embodiment 2. As shown in FIG. 20A, to perform routing paths IN0-to-OUT0, IN1-to-OUT1 and IN2-to-OUT2, NVRSs $S_{00}$, $S_{11}$, $S_{22}$, $S_{40}$, $S_{51}$ and $S_{62}$ are turned on. However, the NVRSs $S_{41}$ and $S_{52}$ fail to be turned OFF (fixed ON defect), which results in collision of IN0, IN1 and FN2. As a result, all the routing paths IN0-to-OUT0, IN1-to-OUT1 and IN2-to-OUT2 cannot be successfully performed. To relieve the fixed ON $S_{41}$ and $S_{52}$, the redundant columns VLR0 and VLR1 replace the defective column VL1 and VL2, respectively. The NVRSs $R_{10}$, $R_{50}$, $R_{21}$ and $R_{61}$ in the redundant columns VLR0 and VLR1 are turned ON, and $S_{11}$, $S_{51}$, $S_{22}$ and $S_{62}$ in defective columns VL1 and VL2 are turned OFF shown in FIG. 20B. As a result, all the routing paths IN0-to-OUT0, IN1-to-OUT1 and IN2-to-OUT2 are relieved.

Embodiment 3

Next, a third embodiment according to the present invention will be presented. The present embodiment discloses low-power high-write-reliability NVRS-based reconfigurable circuit.

Figure 21A:
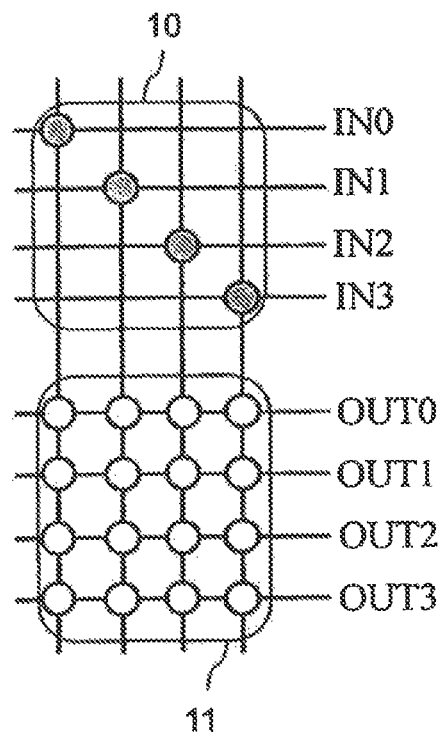
FIG. 21A illustrates a two-level crossbar switch in a NVRS-based reconfigurable circuit according to embodiment 3.
Figure 21B:
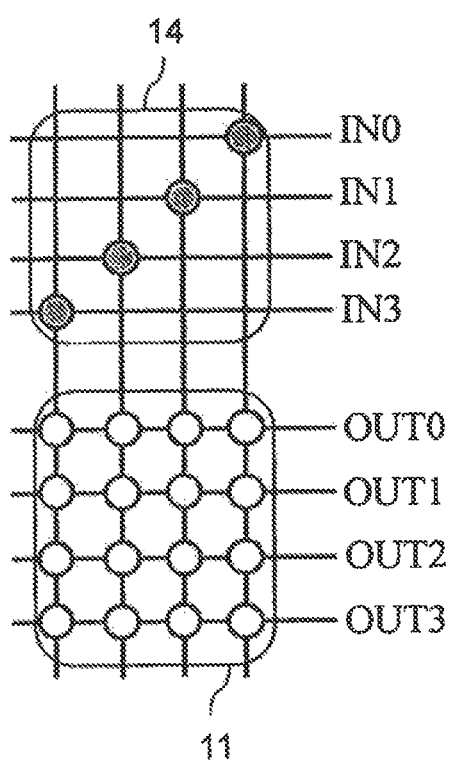
FIG. 21B illustrates a two-level crossbar switch in a NVRS-based reconfigurable circuit according to embodiment 3.
Figure 21C:
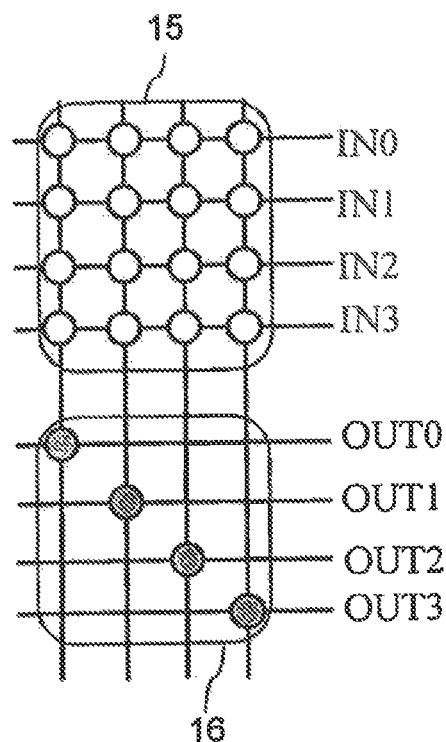
FIG. 21C illustrates a two-level crossbar switch in a NVRS-based reconfigurable circuit according to embodiment 3.
Figure 21D:
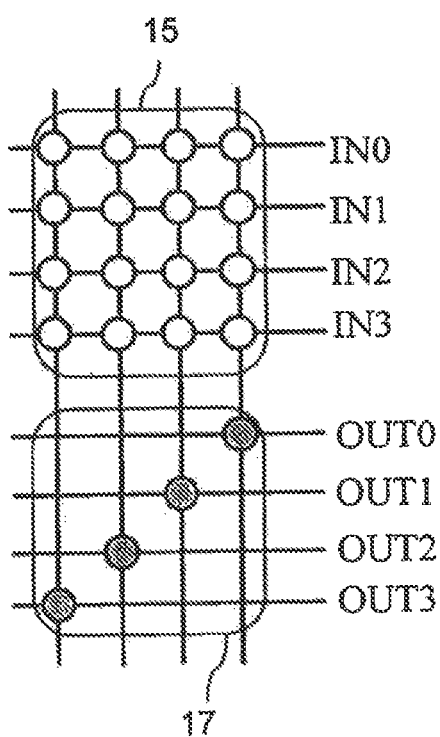
FIG. 21D illustrates a two-level crossbar switch in a NVRS-based reconfigurable circuit according to embodiment 3.

The present embodiment focuses on a particular kind of two-level crossbar switch, where NVRSs are arranged on the diagonal line of the first or second level crossbar switch. FIGS. 21A to 21D show some examples. As shown in FIGS. 21A and 21B, diagonally arranged NVRSs in each of first level crossbar switches 10, 14 are used to control inputs IN0~IN3 connected to second level crossbar switch 11, and second level crossbar switch 11 can be reconfigured to perform different routing paths. As shown in FIGS. 21C and 21D, first level crossbar switch 15 can be reconfigured to perform different routing paths, and diagonally arranged NVRSs in each of second level crossbar switches 16, 17 are used to control outputs OUT0~OUT3. The diagonally arranged NVRSs are used to enable the two-level crossbar switch, and are initially turned ON prior to shipment. Diagonally arranged NVRS in a first (second) level crossbar switch are turned OFF only when fixed "ON" NVRS defects occur in a second (first) level crossbar switch, which leads to high reliability of the diagonally arranged NVRSs.

Figure 22:
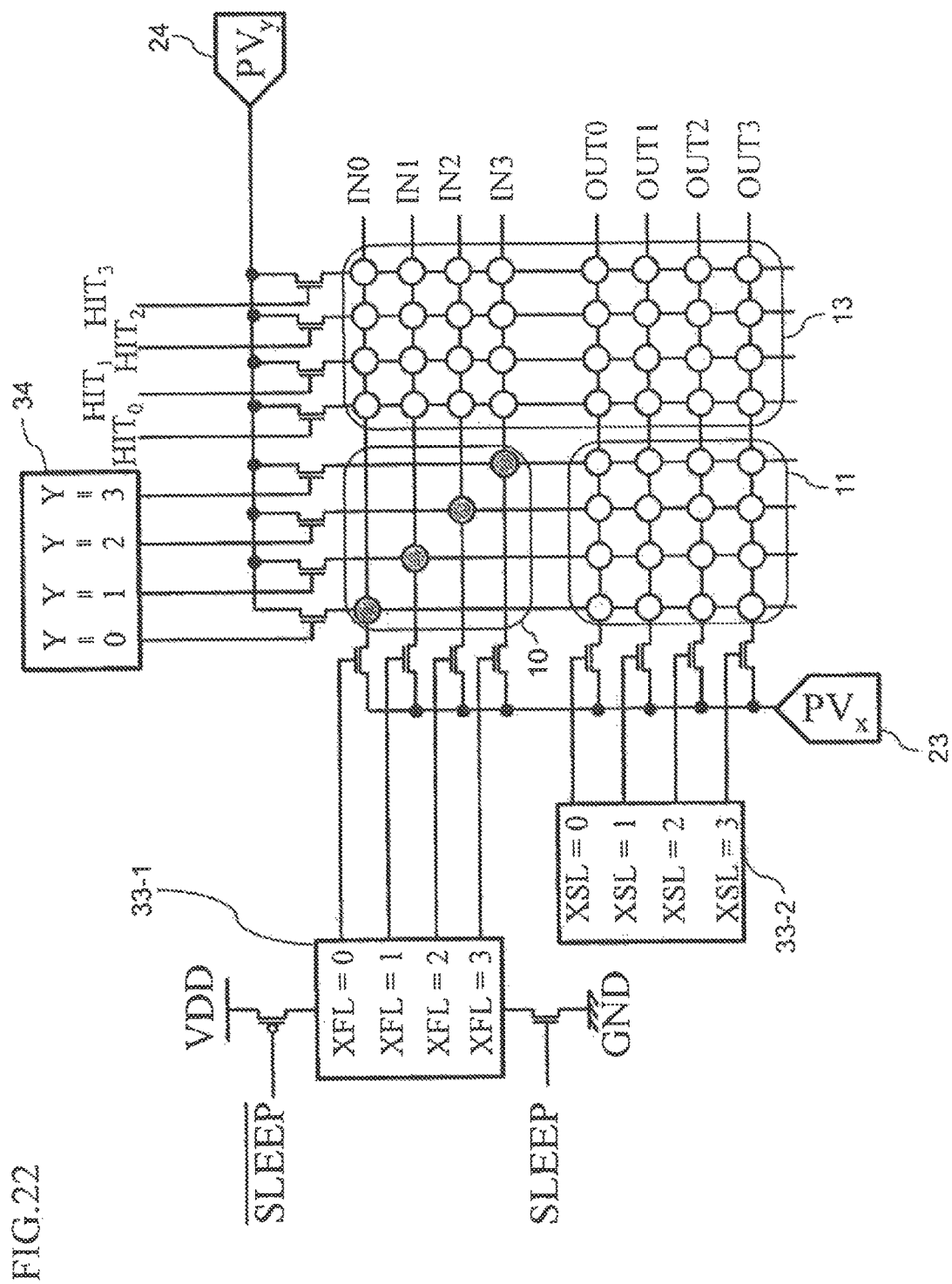
FIG. 22 illustrates a write circuit of the NVRS in a two-level crossbar switch with multiple redundant columns according to embodiment 3.
Figure 23:
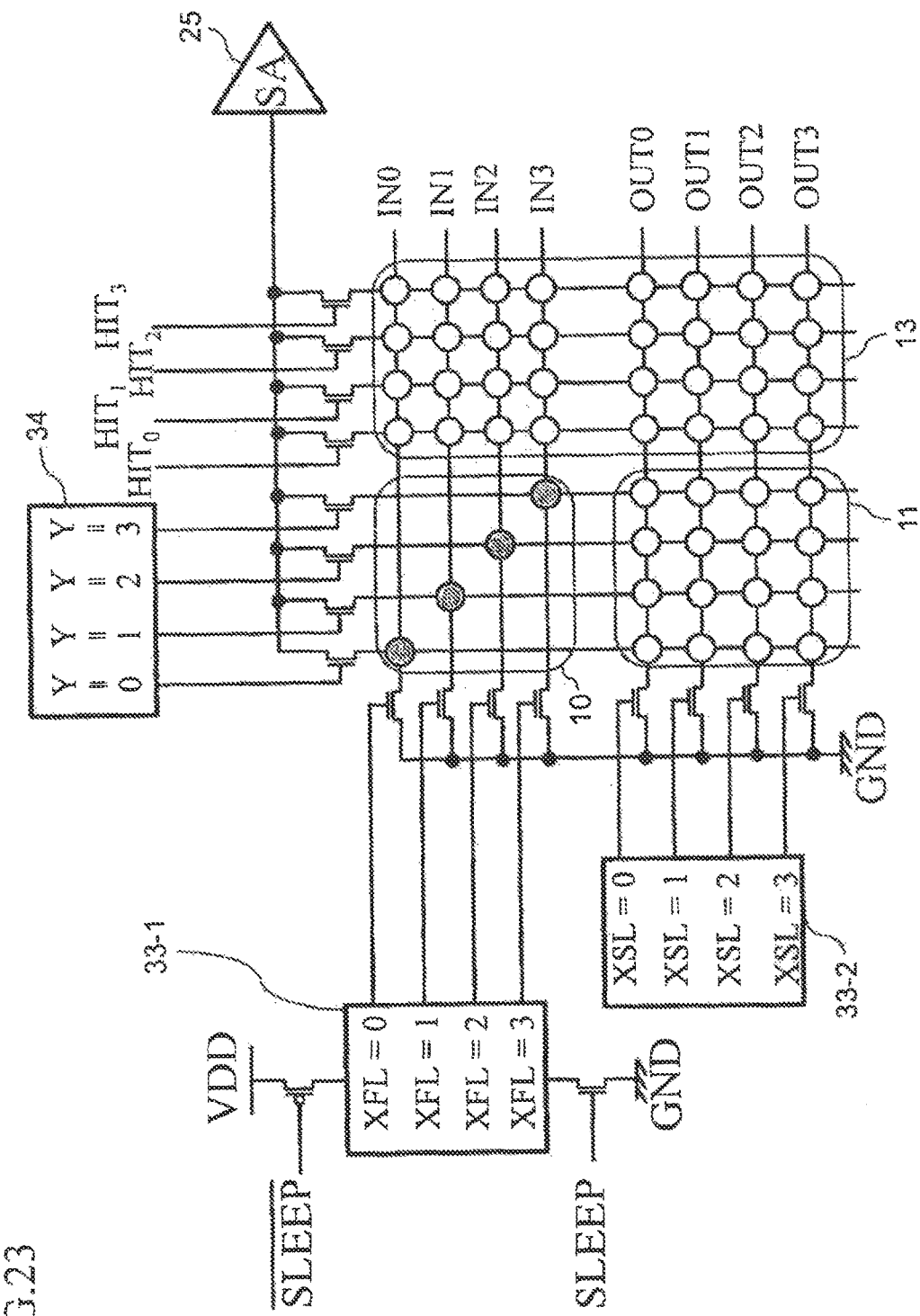
FIG. 23 illustrates a read circuit of the NVRS in a two-level crossbar switch with multiple redundant columns according to embodiment 3.

FIG. 22 and FIG. 23 illustrates write and read circuits of the NVRS in a two-level crossbar switch with multiple redundant columns according to embodiment 3, respectively. The two-level crossbar switch shown in FIG. 21A is used as an example to show the difference between the write and read circuits according to embodiment 2 and those according to embodiment 3. First and second level row address decoders 33-1, 33-2 are used for the first and second level crossbar switches 10, 11, respectively. A first switch is coupled between power supply VDD and first row address decoder 33-1. A second switch is coupled between ground line GND and first row address decoder 33-1. When the first and second switches are turned OFF, first row address decoder 33-1 loses power entirely. On the other hand, when the first and second switches are turned ON, first row address decoder 33-1 receives power. If the two-level crossbar switch shown in FIG. 21C or 21D is used, the first and second switches will be provided in second row address decoder 33-2 instead of first row address decoder 33-1. Power gating technology is introduced in the first level row address decoder. Sleep signal is not active to "HIGH" until fixed ON NVRS defects occur in the second level crossbar switch, which leads low power consumption.

Figure 24A:
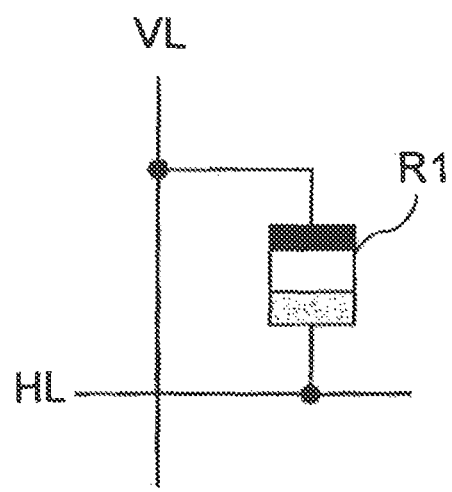
FIG. 24A illustrates a non-volatile switch cell using 1 NVRS.
Figure 24B:
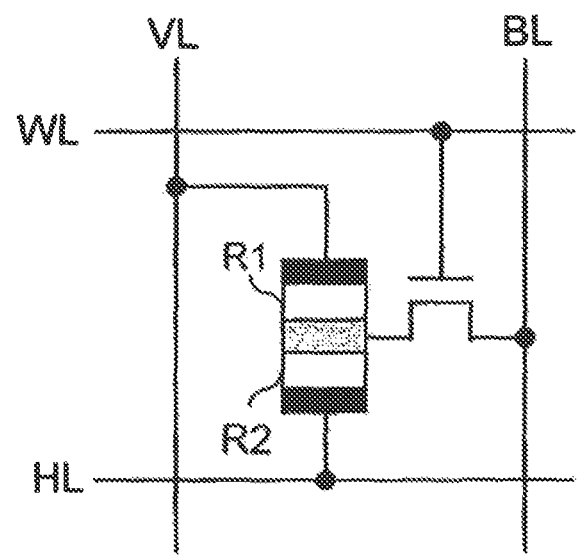
FIG. 24B illustrates a non-volatile switch cell using 1 transistor 2 NVRSs.

In the present invention, a circular symbol used to indicate a NVRS in embodiments 1 to 3 may include all kinds of switch cells composed of NVRSs. For example, not only the switch cell composed of one NVRS R1 shown in FIG. 24A but also the switch cell composed of two NVRSs R1, R2 and one transistor shown in FIG. 24B are included in the present invention. ON/OFF resistance ratio of each of the NVRSs in embodiments 1 to 3 is over $10^4$. Each of the NVRSs in embodiments 1 to 3 comprises a metal oxide resistance change device or a solid electrolyte resistance change device. A semiconductor device may comprise the reconfigurable circuit in embodiments 1 to 3.

The reconfigurable circuit in the present invention may be used in mobile phone, IoT (Internet of Things) devices, and so on.

It is apparent that the present invention is not limited to the above embodiments, but may be modified and changed without departing from the scope and spirit of the invention.

Further Exemplary Embodiment 1

A reconfigurable circuit comprising:
a first level crossbar switch that has first non-volatile resistive switches;
a second level crossbar switch that has second non-volatile resistive switches; and
a first wire and third non-volatile resistive switches that are used for redundancy, wherein
input wires of said second level crossbar switch are connected to output wires of said first level crossbar switch one-to-one, and
input wires of said first level crossbar switch and output wires of said second level crossbar switch are connected to said first wire through said plurality of third non-volatile resistive switches.

Further Exemplary Embodiment 2

The reconfigurable circuit according to Further exemplary embodiment 1, wherein
said third non-volatile resistive switches are fully arranged on said first wire.

Further Exemplary Embodiment 3

The reconfigurable circuit according to Further exemplary embodiment 1, wherein
more than two said first wires are provided; and
said first wires are connected to said input wires of said first level crossbar switch and said output wires of said second level crossbar switch through said third non-volatile resistive switches.

Further Exemplary Embodiment 4

The reconfigurable circuit according to Further exemplary embodiment 3, wherein
said third non-volatile resistive switches are fully arranged on said first wires.

Further Exemplary Embodiment 5

The reconfigurable circuit according to Further exemplary embodiment 1, wherein
said first non-volatile resistive switches are diagonally arranged in said first level crossbar switch, and said second non-volatile resistive switches are fully or sparsely arranged in said second level crossbar switch.

Further Exemplary Embodiment 6

The reconfigurable circuit according to Further exemplary embodiment 5, wherein
said input wires of said first level crossbar switch are connected to source terminals of first transistors one-to-one, wherein
gate terminals of said first transistors are connected to a first row address decoder, and drain terminals of said first transistors are connected to a row write driver;
said output wires of said second level crossbar switch are connected to source terminals of second transistors one-to-one, wherein
gate terminals of said second transistors are connected to a second row address decoder, and drain terminals of said second transistors are connected to said row write driver.

Further Exemplary Embodiment 7

The reconfigurable circuit according to Further exemplary embodiment 6, wherein
a first switch is coupled between power supply and said first row address decoder, and a second switch is coupled between ground line and said first row address decoder, wherein
when said first and second switches are turned OFF, said first row address decoder loses power entirely, and when said first and second switches are turned ON, said first row address decoder receives power.

Further Exemplary Embodiment 8

The reconfigurable circuit according to Further exemplary embodiment 1, wherein
said first non-volatile resistive switches are fully or sparsely arranged in said first level crossbar switch, and said second non-volatile resistive switches are diagonally arranged in said second level crossbar switch.

Further Exemplary Embodiment 9

The reconfigurable circuit according to Further exemplary embodiment 8, wherein
said input wires of said first level crossbar switch are connected to source terminals of first transistors one-to-one, wherein
gate terminals of said first transistors are connected to a first row address decoder, and drain terminals of said first transistors are connected to a row write driver;
said output wires of said second level crossbar switch are connected to source terminals of second transistors one-to-one, wherein
gate terminals of said second transistors are connected to a second row address decoder, and drain terminals of said second transistors are connected to said row write driver.

Further Exemplary Embodiment 10

The reconfigurable circuit according to Further exemplary embodiment 9, wherein
a first switch is coupled between power supply and said second row address decoder, and a second switch is coupled between ground line and said second row address decoder, wherein
when said first and second switches are turned OFF, said second row address decoder loses power entirely, and when said first and second switches are turned ON, said second row address decoder receives power.

Further Exemplary Embodiment 11

The reconfigurable circuit according to any one of Further exemplary embodiments 1 to 10, wherein
ON/OFF resistance ratio of each of said first, second and third non-volatile resistive switches is over $10^4$.

Further Exemplary Embodiment 12

The reconfigurable circuit according to any one of Further exemplary embodiments 1 to 10, wherein
each of said first, second and third non-volatile resistive switches comprises a metal oxide resistance change device or a solid electrolyte resistance change device.

Further Exemplary Embodiment 13

A semiconductor device comprising:
the reconfigurable circuit according to any one of Further exemplary embodiments 1 to 12.

Further Exemplary Embodiment 14

A method for utilizing the reconfigurable circuit according to Further exemplary embodiment 9; the method comprising:
said first and second switches are turned ON when a fixed ON defect occurs in one switch from among said second non-volatile resistive switches.

Further Exemplary Embodiment 15

A method for utilizing the reconfigurable circuit according to Further exemplary embodiment 10; the method comprising:
said first and second switches are turned ON when a fixed ON defect occurs in one switch from among said first non-volatile resistive switches.

What is claimed is:

1. A reconfigurable circuit comprising:
a first level crossbar switch that has first non-volatile resistive switches;
a second level crossbar switch that has second non-volatile resistive switches; and a first wire and third non-volatile resistive switches that are used for redundancy, wherein
input wires of said second level crossbar switch are connected to output wires of said first level crossbar switch one-to-one, and
input wires of said first level crossbar switch and output wires of said second level crossbar switch are connected to said first wire through said third non-volatile resistive switches.

2. The reconfigurable circuit according to claim 1, wherein
said input wires of said first level crossbar switch and said output wires of said second level crossbar switch are connected to source terminals of first transistors one-to-one, wherein
gate terminals of said first transistors are connected to a row address decoder, and drain terminals of said first transistors are connected to a row write driver;
said output wires of said first level crossbar switch are connected to source terminals of second transistors one-to-one, wherein
gate terminals of said second transistors are connected to a column address decoder, and drain terminals of said second transistors are connected to a column write driver;
said first wire is connected to a source terminal of a third transistor, wherein a gate terminal of said third transistor is connected to a redundancy enable signal line, and a drain terminal of said third transistor is connected to said column write driver.

3. The reconfigurable circuit according to claim 1, wherein
more than two of said first wires are provided; and
said first wires are connected to said input wires of said first level crossbar switch and said output wires of said second level crossbar switch through said third non-volatile resistive switches.

4. The reconfigurable circuit according to claim 3, wherein
said input wires of said first level crossbar switch and said output wires of said second level crossbar switch are connected to source terminals of first transistors one-to-one, wherein
gate terminals of said first transistors are connected to a row address decoder, and drain terminals of said first transistors are connected to a row write driver;
said output wires of said first level crossbar switch are connected to source terminals of second transistors one-to-one, wherein
gate terminals of said second transistors are connected to a column address decoder, and drain terminals of said second transistors are connected to a column write driver;
said first wires are connected to source terminals of third transistors, wherein gate terminals of said third transistors are connected to redundancy enable signal lines one-to-one, and drain terminals of said third transistors are connected to said column write driver.

5. The reconfigurable circuit according to claim 1, wherein
said first non-volatile resistive switches are diagonally arranged in said first level crossbar switch, and said second non-volatile resistive switches are fully or sparsely arranged in said second level crossbar switch.

6. The reconfigurable circuit according to claim 5, wherein
said input wires of said first level crossbar switch are connected to source terminals of first transistors one-to-one, wherein
gate terminals of said first transistors are connected to a first row address decoder, and drain terminals of said first transistors are connected to a row write driver;
said output wires of said second level crossbar switch are connected to source terminals of second transistors one-to-one, wherein
gate terminals of said second transistors are connected to a second row address decoder, and drain terminals of said second transistors are connected to said row write driver.

7. A method for utilizing the reconfigurable circuit according to claim 5; the method comprising:
said first non-volatile resistive switches are initially set to be ON, wherein
when a fixed ON defect occurs in one switch from among said second non-volatile resistive switches, said first non-volatile resistive switch, which is arranged on the same wire of defective second non-volatile resistive switch corresponding to said fixed ON defect, is turned OFF.

8. The reconfigurable circuit according to claim 1, wherein
said first non-volatile resistive switches are fully or sparsely arranged in said first level crossbar switch, and said second non-volatile resistive switches are diagonally arranged in said second level crossbar switch.

9. The reconfigurable circuit according to claim 8, wherein
said input wires of said first level crossbar switch are connected to source terminals of first transistors one-to-one, wherein
gate terminals of said first transistors are connected to a first row address decoder, and drain terminals of said first transistors are connected to a row write driver;
said output wires of said second level crossbar switch are connected to source terminals of second transistors one-to-one, wherein
gate terminals of said second transistors are connected to a second row address decoder, and drain terminals of said second transistors are connected to said row write driver.

10. A method for utilizing the reconfigurable circuit according to claim 8; the method comprising:
said second non-volatile resistive switches are initially set to be ON, wherein
when a fixed ON defect occurs in one switch from among said first non-volatile resistive switches, said second non-volatile resistive switch, which is arranged on the same wire of defective first non-volatile resistive switch corresponding to said fixed ON defect, is turned OFF.

* * * * *